US010636668B2

(12) United States Patent
Oota et al.

(10) Patent No.: US 10,636,668 B2
(45) Date of Patent: Apr. 28, 2020

(54) DISPLAY APPARATUS, INTERLAYER FILM FOR LAMINATED GLASS, AND LAMINATED GLASS

(71) Applicant: SEKISUI CHEMICAL CO., LTD., Osaka (JP)

(72) Inventors: Yuusuke Oota, Shiga (JP); Yasuyuki Izu, Shiga (JP); Daisuke Nakajima, Shiga (JP)

(73) Assignee: SEKISUI CHEMICAL CO., LTD., Osaka (JP)

(*) Notice: Subject to any disclaimer, the term of this patent is extended or adjusted under 35 U.S.C. 154(b) by 315 days.

(21) Appl. No.: 15/623,785

(22) Filed: Jun. 15, 2017

(65) Prior Publication Data
US 2017/0287369 A1 Oct. 5, 2017

Related U.S. Application Data

(63) Continuation of application No. PCT/JP2015/086005, filed on Dec. 24, 2015.

(30) Foreign Application Priority Data

Dec. 24, 2014 (JP) ................................ 2014-261325
Dec. 24, 2014 (JP) ................................ 2014-261326

(51) Int. Cl.
*H01L 21/3105* (2006.01)
*B32B 17/10* (2006.01)
(Continued)

(52) U.S. Cl.
CPC .... *H01L 21/3105* (2013.01); *B32B 17/10036* (2013.01); *B32B 17/10568* (2013.01);
(Continued)

(58) Field of Classification Search
CPC ........... H01L 21/3105; H01L 21/02321; H01L 21/76801; H01L 21/0003; H01L 21/0038;
(Continued)

(56) References Cited

U.S. PATENT DOCUMENTS

2012/0299328 A1 11/2012 Labrot et al.
2013/0050983 A1 2/2013 Labrot et al.
(Continued)

FOREIGN PATENT DOCUMENTS

CN 103889917 A 6/2014
EP 3176136 A1 6/2017
(Continued)

OTHER PUBLICATIONS

Huang, Ling et al., Bright red electroluminescent devices using novel second-ligand-contained europium complexes as emitting layers, 2001, J. Mater. Chem., 11, 790-793.*
(Continued)

*Primary Examiner* — Eli D. Strah
(74) *Attorney, Agent, or Firm* — Osha Liang LLP

(57) ABSTRACT

A display apparatus includes laminated glass comprising an interlayer film laminated between a pair of glass plates; and an irradiation device irradiating the laminated glass with light rays, wherein the interlayer film comprises a thermoplastic resin and a luminescent material, wherein an output of the light rays radiated from the irradiation device is equal to or less than 1 mW, and wherein the laminated glass emits light at a luminance of equal to or greater than 1 cd/m² when being irradiated with the light rays.

6 Claims, 1 Drawing Sheet

(51) Int. Cl.
*H01L 21/02* (2006.01)
*H01L 21/768* (2006.01)
*H01L 51/00* (2006.01)
*H01L 51/52* (2006.01)

(52) U.S. Cl.
CPC .. *B32B 17/10669* (2013.01); *B32B 17/10688* (2013.01); *H01L 21/02321* (2013.01); *H01L 21/76801* (2013.01); *H01L 51/0003* (2013.01); *H01L 51/0038* (2013.01); *H01L 51/5253* (2013.01); *B32B 2457/20* (2013.01); *H01L 2251/5315* (2013.01)

(58) Field of Classification Search
CPC ......... H01L 21/5253; H01L 2251/5315; B32B 17/10669; B32B 17/10036; B32B 17/10688; B32B 17/10568; B32B 17/10541; B32B 2457/20; B32B 7/02; B32B 2605/006; B60J 1/02; G02B 27/01
See application file for complete search history.

(56) References Cited

U.S. PATENT DOCUMENTS

| | | |
|---|---|---|
| 2014/0377567 A1 | 12/2014 | Ii et al. |
| 2015/0251385 A1 | 9/2015 | Oota et al. |
| 2015/0280037 A1 | 10/2015 | Kataoka |
| 2016/0214353 A1 | 7/2016 | Oowashi et al. |

FOREIGN PATENT DOCUMENTS

| | | | | |
|---|---|---|---|---|
| EP | 3192776 A1 | 7/2017 | | |
| JP | 03141138 A | * | 6/1991 | |
| JP | H03-141138 A | | 6/1991 | |
| JP | H4-502525 A | | 5/1992 | |
| JP | 2014-24312 A | | 2/2014 | |
| JP | 5503089 B1 | | 5/2014 | |
| WO | 91/06031 A1 | | 5/1991 | |
| WO | 2011/042384 A1 | | 4/2011 | |
| WO | 2012/010444 A1 | | 1/2012 | |
| WO | 2014/051139 A1 | | 4/2014 | |
| WO | 2014054720 A1 | | 4/2014 | |
| WO | WO-2014051140 A1 | * | 4/2014 | ............. C09K 11/06 |
| WO | 2015/046541 A1 | | 4/2015 | |

OTHER PUBLICATIONS

Hu, Wenping et al., Red Electroluminescence from an Organic Europium Complex with a Triphenylphosphine Oxide Ligand, 2000, Jpn. J. Appl. Phys., 39, 6445-6448.*
International Search Report and Written Opinion dated Mar. 29, 2016, issued by the Japan Patent Office in corresponding International Application No. PCT/JP2015/086005, with English translation (12 pages).
International Preliminary Report on Patentability (IPRP) dated Jun. 27, 2017, issued by the International Bureau of WIPO in corresponding International Patent Application No. PCT/JP2015/086005, with English translation (9 pages).
Office Action issued in corresponding Chinese Patent Application No. 201580027112.9; dated Jun. 21, 2019 (9 pages).
Extended European Search Report issued in European Application No. 15873160.4, dated May 28, 2018 (8 pages).

* cited by examiner

DISPLAY APPARATUS, INTERLAYER FILM FOR LAMINATED GLASS, AND LAMINATED GLASS

TECHNICAL FIELD

One or more embodiments of the present invention relate to a display apparatus from which a predetermined initial luminance is obtained even in a case where the display apparatus is irradiated with low-intensity light rays, an interlayer film for laminated glass, and laminated glass.

BACKGROUND

Laminated glass is safe because it generates only a small amount of scattering glass fragments even when subjected to external impact and broken. Therefore, laminated glass is widely used as windshields, side windows, and rear windows of vehicles such as automobiles, window glass of airplanes or buildings, or the like. Examples of laminated glass include laminated glass obtained by interposing an interlayer film for laminated glass, which contains a liquid plasticizer and a polyvinyl acetal resin, between at least a pair of glass plates and integrating the resultant.

In recent years, instrument display presenting speed information or the like, which is automobile driving data, has been increasingly required to be performed as head-up display (HUD) within the same visual field as that of a windshield for automobiles.

So far, various types of HUD have been developed. As the most common type of HUD, there is a HUD in which speed information or the like sent from a control unit is reflected to the windshield from a display unit of an instrument panel such that a driver can visually recognize the speed information or the like in the same position, that is, within the same visual field as that of the windshield.

As an interlayer film for laminated glass for a HUD, for example, PTL 1 suggests a wedge-shaped interlayer film for laminated glass having a specific wedge angle, as a solution to a defect of a HUD in which instrument displays appear to overlap in laminated glass.

The laminated glass described in PTL 1 can solve the defect of a HUD, in which instrument displays appear to overlap, as long as the defect is caused only in a portion within the surface of the laminated glass. That is, the laminated glass cannot solve a problem in which instrument displays appear to overlap within the entire surface of the laminated glass.

In contrast, in PTL 2, the applicant of the present application discloses an interlayer film for laminated glass having a luminescent layer containing a binder resin and at least one kind of luminescent material selected from the group consisting of luminescent particles, a luminescent pigment, and a luminescent dye. The luminescent material such as luminescent particles, a luminescent pigment, or a luminescent dye has properties of emitting light by being irradiated with light having a specific wavelength. Due to irradiating the interlayer film for laminated glass formulated with the above luminescent material with light rays, the luminescent particles contained in the interlayer film emit light, and in this way, an image with high contrast can be displayed.

CITATION LIST

Patent Literature

[PTL 1] JP-T-4-502525
[PTL 2] JP-A-2014-24312

In order to display an image with higher contrast in a luminescent sheet formulated with a luminescent material, the luminescent sheet needs to be irradiated with high-intensity light rays. However, in a case where high-intensity light rays are used, light transmitted through the luminescent sheet is directly observed by a human being. For example, in a case where a light ray irradiation device is installed in a car equipped with a windshield including a luminescent sheet as an interlayer film for laminated glass, and the windshield is irradiated with high-intensity light rays, the driver of an oncoming car may observe the high-intensity light rays and may be dazzled, and this may lead to an accident. It is considered that this is likely to occur particularly in the nighttime during which relatively bright light rays need to be radiated in an environment with dark surroundings.

One or more embodiments of the present invention have been made in consideration of the above circumstances, and provide a display apparatus from which a predetermined initial luminance is obtained even in a case where the display apparatus is irradiated with low-intensity light rays, an interlayer film for laminated glass, and laminated glass.

SUMMARY

One or more embodiments of the present invention relate to a display apparatus having laminated glass, in which an interlayer film for laminated glass containing a thermoplastic resin and a luminescent material is laminated between a pair of glass plates, and an irradiation device which irradiates the laminated glass with light rays. In the display apparatus, an output of the light rays radiated from the irradiation device is equal to or less than 1 mW, and the laminated glass emits light at a luminance of equal to or greater than 1 cd/m$^2$ when being irradiated with the light rays.

Hereinafter, one or more embodiments of the present invention will be specifically described.

The inventors examined a display apparatus from which a predetermined initial luminance is obtained even when the display apparatus is irradiated with low-intensity light rays. As a result, the inventors found that the use of low-intensity light rays having an output of equal to or less than 1 mW makes it possible to obtain a safe display apparatus from which a predetermined initial luminance is obtained.

From the display apparatus according to one or more embodiments of the present invention, a predetermined initial luminance is obtained even when the apparatus is irradiated with low-intensity light rays. Therefore, the display apparatus may be suitable for nightvision.

The display apparatus according to one or more embodiments of the present invention has laminated glass and an irradiation device which irradiates the laminated glass with light rays.

The laminated glass is obtained by laminating an interlayer film for laminated glass, which contains a thermoplastic resin and a luminescent material, between two glass plate sheets.

The thermoplastic resin is not particularly limited, and examples thereof include a polyvinyl acetal resin, an ethylene-vinyl acetate copolymer resin, an ethylene-acryl copolymer resin, a polyurethane resin, a polyurethane resin containing elemental sulfur, a polyvinyl alcohol resin, a vinyl chloride resin, a polyethylene terephthalate resin, and the like. In a case where a plasticizer is used in combination with these resins, among the above, a polyvinyl acetal resin may be suitable because an interlayer film for laminated glass that exhibits excellent adhesiveness with respect to glass is obtained.

The aforementioned polyvinyl acetal is not particularly limited as long as it is a polyvinyl acetal obtained by acetalizing a polyvinyl alcohol by using an aldehyde. As the polyvinyl acetal, polyvinyl butyral may be suitable, and if necessary, two or more kinds of polyvinyl acetal may be used in combination.

A lower limit and an upper limit of a degree of acetalization of the polyvinyl acetal may be 40 mol % and 85 mol % respectively, or 60 mol % and 75 mol % respectively.

A lower limit and an upper limit of an amount of hydroxyl groups in the polyvinyl acetal may be 15 mol % and 35 mol % respectively. In a case where the amount of hydroxyl groups is equal to or greater than 15 mol %, an interlayer film for laminated glass is easily molded. In a case where the amount of hydroxyl group is equal to or less than 35 mol %, handling of the obtained interlayer film for laminated glass becomes easy.

The degree of acetalization and the amount of hydroxyl groups described above can be measured based on, for example, JIS K6728 "Testing methods for polyvinyl butyral".

The aforementioned polyvinyl acetal can be prepared by acetalizing a polyvinyl alcohol by using an aldehyde. Generally, the polyvinyl alcohol is obtained by saponifying polyvinyl acetate. Usually, a polyvinyl alcohol having a degree of saponification of 70 to 99.8 mol % is used.

A lower limit and an upper limit of a degree of polymerization of the polyvinyl alcohol may be 500 and 4,000 respectively. In a case where the degree of polymerization of the polyvinyl alcohol is equal to or greater than 500, penetration resistance of the obtained laminated glass can be improved. In a case where the degree of polymerization of the polyvinyl alcohol is equal to or less than 4,000, an interlayer film for laminated glass can be easily molded. The lower limit and the upper limit of the degree of polymerization of the polyvinyl alcohol may be 1,000 and 3,600 respectively.

The aforementioned aldehyde is not particularly limited, and generally, an aldehyde having 1 to 10 carbon atoms may be used. The aldehyde having 1 to 10 carbon atoms is not particularly limited, and examples thereof include n-butyraldehyde, isobutyraldehyde, n-valeraldehyde, 2-ethylbutyraldehyde, n-hexylaldehyde, n-octylaldehyde, n-nonylaldehyde, n-decylaldehyde, formaldehyde, acetaldehyde, benzaldehyde, and the like. Among these, n-butyraldehyde, n-hexylaldehyde, and n-valeraldehyde may be used. One kind of these aldehydes may be used singly, or two or more kinds thereof may be used in combination.

Examples of the aforementioned luminescent material include a lanthanoid complex having a halogen atom-containing multidentate ligand.

Among lanthanoid complexes, a lanthanoid complex having a halogen atom-containing multidentate ligand emits light at a high luminescence intensity by being irradiated with light rays. Examples of the lanthanoid complex having a halogen atom-containing multidentate ligand include a lanthanoid complex having a halogen atom-containing bidentate ligand, a lanthanoid complex having a halogen atom-containing tridentate ligand, a lanthanoid complex having a halogen atom-containing tetradentate ligand, a lanthanoid complex having a halogen atom-containing pentadentate ligand, a lanthanoid complex having a halogen atom-containing hexadentate ligand, and the like.

Among the above, a lanthanoid complex having a halogen atom-containing bidentate ligand or a lanthanoid complex having a halogen atom-containing tridentate ligand emits light having a wavelength of 580 to 780 nm at an extremely high luminescence intensity by being irradiated with light having a wavelength of 300 to 410 nm. Because the above lanthanoid complex emits light at an extremely high intensity, an interlayer film for laminated glass having a luminescent layer containing the lanthanoid complex can emit light at a luminance of 1.3 to 165 cd/m$^2$ even when being irradiated with low-intensity light rays having an output of equal to or less than 1 mW. In a case where such an interlayer film for laminated glass is used, display can be performed with sufficient contrast, and a human being is not dazzled even if the human being directly observes light rays transmitted through the interlayer film for laminated glass.

Furthermore, the lanthanoid complex having a halogen atom-containing bidentate ligand or the lanthanoid complex having a halogen atom-containing tridentate ligand also has excellent heat resistance. In many cases, a windshield is used under a high-temperature condition because it is irradiated with infrared rays of sunlight. Under such a high-temperature condition, the luminescent material deteriorates, and hence the luminance is markedly reduced particularly at the edge of the laminated glass in some cases. In a case where a lanthanoid complex having a halogen atom-containing bidentate ligand or a lanthanoid complex having a halogen atom-containing tridentate ligand is used as the luminescent material, it is possible to obtain an interlayer film for laminated glass in which the luminance hardly varies even under a high-temperature condition.

One or more embodiments of the present invention also include an interlayer film for laminated glass which has a luminescent layer containing a thermoplastic resin and a lanthanoid complex having a halogen atom-containing bidentate ligand or a lanthanoid complex having a halogen atom-containing tridentate ligand, and emits light at a luminance of 1.3 to 165 cd/m$^2$ when being irradiated with light rays having an output of equal to or less than 1 mW.

In a case where the laminated glass, which emits light at a luminance of 1.3 to 165 cd/m$^2$ when being irradiated with light rays having an output of equal to or less than 1 mW, is used, it is possible to obtain a highly visible image which is not too bright and not too dark for a driver to observe it even at nighttime during which the surroundings are dark. Therefore, the laminated glass may be suitable for nightvision.

One or more embodiments of the present invention also include laminated glass in which the aforementioned interlayer film for laminated glass is laminated between a pair of glass plates.

In one or more embodiments, the luminance of light emitted from the interlayer film for laminated glass can be measured by, for example, a method of preparing laminated glass by means of interposing the interlayer film for laminated glass between two clear glass sheets having a thickness of 2.5 mm and measuring the luminance of the laminated glass. More specifically, the luminance of the interlayer film for laminated glass can be measured in a manner in which the entire surface of the laminated glass is irradiated in a dark room with light from a light source (for example, a High Power xenon light source (for example, "REX-250" manufactured by Asahi Spectra Co., Ltd., irradiation wavelength: 405 nm)) disposed in a position 10 cm distant from the surface of the laminated glass in a direction perpendicular to the surface of the laminated glass, and the luminance is measured using a luminance meter (for example, "SR-3AR" manufactured by TOPCON TECHNO- HOUSE CORPORATION) disposed in a position 35 cm distant from the surface of the laminated glass being irradiated with light, and at an angle of 45° with respect to the laminated glass surface.

In the present specification, lanthanoid includes lanthanum, cerium, praseodymium, neodymium, promethium, samarium, europium, gadolinium, terbium, dysprosium, holmium, erbium, thulium, ytterbium, or lutetium. The lanthanoid may be neodymium, europium, or terbium, because these make it possible to obtain a higher luminescence intensity.

Examples of the aforementioned lanthanoid complex having a halogen atom-containing bidentate ligand include tris(trifluoroacetylacetone)phenanthroline europium, tris(trifluoroacetylacetone)diphenylphenanthroline europium, tris(hexafluoroacetylacetone)diphenylphenanthroline europium, tris(hexafluoroacetylacetone)bis(triphenylphosphine)europium, tris(trifluoroacetylacetone)2,2'-bipyridine europium, tris(hexafluoroacetylacetone)2,2'-bipyridine europium, and the like.

Examples of the aforementioned lanthanoid complex having a halogen atom-containing tridentate ligand include terpyridine trifluoroacetylacetone europium, terpyridine hexafluoroacetylacetone europium, and the like.

As halogen atoms of the lanthanoid complex having a halogen atom-containing bidentate ligand or the lanthanoid complex having a halogen atom-containing tridentate ligand, a fluorine atom, a chlorine atom, a bromine atom, or an iodine atom can be used. Among these, a fluorine atom may be used because it stabilizes the structure of the ligand.

Among the lanthanoid complexes having a halogen atom-containing bidentate ligand and the lanthanoid complexes having a halogen atom-containing tridentate ligand, a lanthanoid complex having a halogen atom-containing bidentate ligand having an acetylacetone skeleton may be suitable because this lanthanoid complex has particularly excellent initial luminescent properties.

Examples of the lanthanoid complex having a halogen atom-containing bidentate ligand having an acetylacetone skeleton include Eu(TFA)$_3$phen, Eu(TFA)$_3$dpphen, Eu(HFA)$_3$phen, [Eu(FOD)$_3$]bpy, [Eu(TFA)$_3$]tmphen, [Eu(FOD)$_3$]phen, and the like. The structures of these lanthanoid complexes having a halogen atom-containing bidentate ligand having an acetylacetone skeleton will be shown.

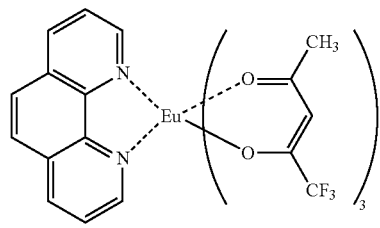

Eu(TFA)$_3$phen

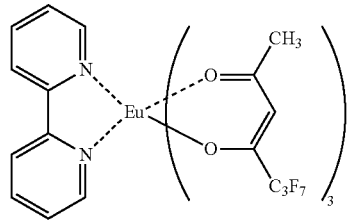

[Eu(FOD)$_3$]bpy

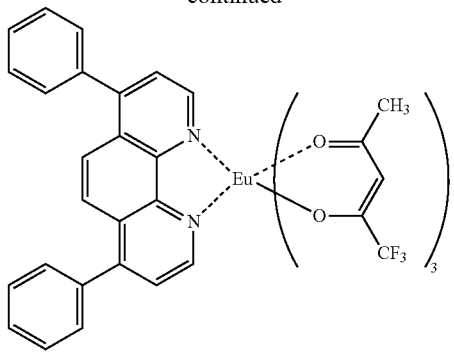

Eu(TFA)$_3$dpphen

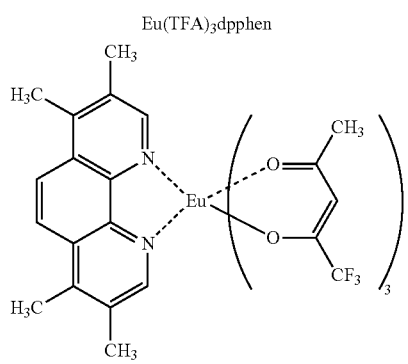

[Eu(TFA)$_3$]tmphen

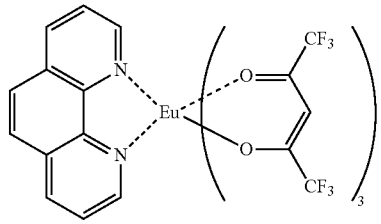

Eu(HFA)$_3$phen

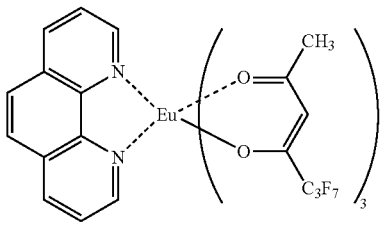

[Eu(FOD)$_3$]phen

The lanthanoid complex having a halogen atom-containing bidentate ligand or the lanthanoid complex having a halogen atom-containing tridentate ligand described above may be used in the form of particles. In a case where the lanthanoid complex is in the form of particles, the lanthanoid complex having a halogen atom-containing bidentate ligand or the lanthanoid complex having a halogen atom-containing tridentate ligand is more easily finely dispersed in the interlayer film for laminated glass.

In a case where the lanthanoid complex having a halogen atom-containing bidentate ligand or the lanthanoid complex having a halogen atom-containing tridentate ligand is in the form of particles, a lower limit and an upper limit of an average particle size of the lanthanoid complex may be 0.01 μm and 10 μm respectively, or 0.03 μm and 1 μm respectively.

A lower limit and an upper limit of a content of the lanthanoid complex having a halogen atom-containing bidentate ligand or the lanthanoid complex having a halogen atom-containing tridentate ligand in the interlayer film for laminated glass may be 0.001 parts by weight and 10 parts by weight respectively with respect to 100 parts by weight of the aforementioned thermoplastic resin. In a case where the content of the lanthanoid complex having a halogen atom-containing bidentate ligand or the lanthanoid complex having a halogen atom-containing tridentate ligand is equal to or greater than 0.001 parts by weight, an image with higher contrast can be displayed. In a case where the content of the lanthanoid complex having a halogen atom-containing bidentate ligand or the lanthanoid complex having a halogen atom-containing tridentate ligand is equal to or less than 10 parts by weight, transparency of the interlayer film for laminated glass is further improved. The lower limit and the upper limit of the content of the lanthanoid complex having a halogen atom-containing bidentate ligand or the lanthanoid complex having a halogen atom-containing tridentate ligand may be 0.01 parts by weight and 5 parts by weight respectively, or 0.05 parts by weight and 1 part by weight respectively.

As the aforementioned luminescent material, a luminescent material having a terephthalic acid ester structure can also be used. The luminescent material having a terephthalic acid ester structure emits light by being irradiated with light rays.

Examples of the luminescent material having a terephthalic acid ester structure include a compound having a structure represented by the following Formula (1) and a compound having a structure represented by the following Formula (2).

One kind of these compounds may be used singly, or two or more kinds thereof may be used.

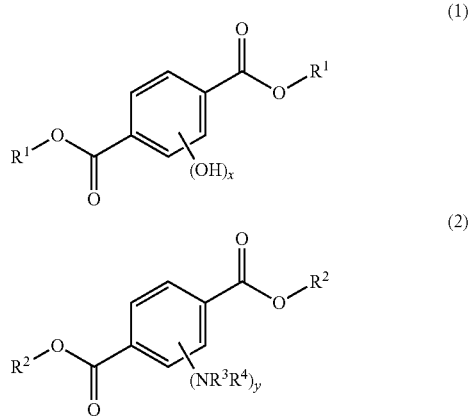

In Formula (1), $R^1$ represents an organic group, and x represents 1, 2, 3, or 4.

x may represent 1 or 2, and the compound may have a hydroxyl group in the 2-position or the 5-position of a benzene ring and may have a hydroxyl group in the 2-position and the 5-position of a benzene ring, because then the transparency of the interlayer film for laminated glass is further improved.

The organic group represented by $R^1$ may be a hydrocarbon group, such as a hydrocarbon group having 1 to 10 carbon atoms, a hydrocarbon group having 1 to 5 carbon atoms, and a hydrocarbon group having 1 to 3 carbon atoms.

In a case where the number of carbon atoms of the hydrocarbon group is equal to or less than 10, the aforementioned luminescent material having a terephthalic acid ester structure can be easily dispersed in the interlayer film for laminated glass.

The hydrocarbon group may be an alkyl group.

Examples of the compound having a structure represented by Formula (1) include diethyl-2,5-dihydroxyterephthalate, dimethyl-2,5-dihydroxyterephthalate, and the like.

Among these, as the compound having a structure represented by Formula (1), diethyl-2,5-dihydroxyterephthalate ("diethyl 2,5-dihydroxyterephthalate" manufactured by Sigma-Aldrich Co., LLC.) may be used because this compound makes it possible to display an image with higher contrast.

In Formula (2), $R^2$ represents an organic group, each of $R^3$ and $R^4$ represents a hydrogen atom or an organic group, and y represents 1, 2, 3, or 4.

The organic group represented by $R^2$ may be a hydrocarbon group, such as a hydrocarbon group having 1 to 10 carbon atoms, a hydrocarbon group having 1 to 5 carbon atoms, and a hydrocarbon group having 1 to 3 carbon atoms.

In a case where the number of carbon atoms of the hydrocarbon group is equal to or less than the aforementioned upper limit, the luminescent material having a terephthalic acid ester structure can be easily dispersed in the interlayer film for laminated glass.

The hydrocarbon group may be an alkyl group.

$NR^3R^4$ in Formula (2) is an amino group.

Each of $R^3$ and $R^4$ may be a hydrogen atom.

Regarding hydrogen atoms, the benzene ring in the compound having a structure represented by Formula (2) may have the aforementioned amino group at the position of one hydrogen atom, at the positions of two hydrogen atoms, at the positions of three hydrogen atoms, or at the positions of four hydrogen atoms.

As the compound having a structure represented by Formula (2), diethyl-2,5-diaminoterephthalate (manufactured by Sigma-Aldrich Co., LLC.) may be used because this compound makes it possible to display an image with higher contrast.

A content of the luminescent material having a terephthalic acid ester structure in the interlayer film for laminated glass is not particularly limited. A lower limit and an upper limit of the content of the luminescent material having a terephthalic acid ester structure in the interlayer film for laminated glass may be 0.001 parts by weight and 15 parts by weight respectively with respect to 100 parts by weight of the aforementioned thermoplastic resin.

In a case where the content of the luminescent material having a terephthalic acid ester structure is equal to or greater than 0.001 parts by weight, the interlayer film for laminated glass can display an image with higher contrast by being irradiated with light rays.

In a case where the content of the luminescent material having a terephthalic acid ester structure is equal to or less than 15 parts by weight, the transparency of the interlayer film for laminated glass is further improved.

The lower limit and the upper limit of the content of the luminescent material having a terephthalic acid ester structure may be 0.01 parts by weight and 10 parts by weight respectively, 0.1 parts by weight and 8 parts by weight respectively, or 0.5 parts by weight and 5 parts by weight respectively.

A lower limit and an upper limit of a content of the luminescent material having a terephthalic acid ester structure in the interlayer film for laminated glass may be 0.007% by weight and 4.5% by weight respectively with respect to 100% by weight of the interlayer film for laminated glass.

In a case where the content of the luminescent material having a terephthalic acid ester structure is equal to or greater than 0.007% by weight, an image with higher contrast can be displayed.

In a case where the content of the luminescent material having a terephthalic acid ester structure is equal to or less than 4.5% by weight, the transparency of the interlayer film for laminated glass can be further improved.

The lower limit and the upper limit of the content of the luminescent material having a terephthalic acid ester structure may be 0.01% by weight and 4% by weight respectively, or 0.1% by weight and 3.5% by weight respectively.

The interlayer film for laminated glass can contain potassium, sodium, and magnesium derived from raw materials such as a neutralizer used at the time of manufacturing the thermoplastic resin. A total content of potassium, sodium, and magnesium contained in the interlayer film for laminated glass may be equal to or less than 50 ppm.

In a case where the total content of potassium, sodium, and magnesium is equal to or less than 50 ppm, it is possible to prevent the deterioration of luminescent properties of the lanthanoid complex having a halogen atom-containing bidentate ligand or the lanthanoid complex having a halogen atom-containing tridentate ligand that is used in combination.

The content of magnesium contained in the interlayer film for laminated glass may be equal to or less than 40 ppm. In a case where the content of magnesium contained in the interlayer film for laminated glass is equal to or less than 40 ppm, it is possible to more reliably inhibit the deterioration of luminescent performance of the lanthanoid complex having a halogen atom-containing bidentate ligand or the lanthanoid complex having a halogen atom-containing tridentate ligand in the interlayer film for laminated glass. The content of magnesium contained in the interlayer film for laminated glass may be equal to or less than 35 ppm, equal to or less than 30 ppm, or equal to or less than 20 ppm. The content of magnesium in the interlayer film for laminated glass may be 0 ppm.

In order to make the total content of potassium, sodium, and magnesium in the interlayer film for laminated glass become equal to or less than 50 ppm, it is possible to wash the thermoplastic resin with an excess of deionized water plural times.

The interlayer film for laminated glass may further contain a dispersant. In a case where the interlayer film for laminated glass contains a dispersant, aggregation of the luminescent material can be inhibited, and hence light can be more uniformly emitted.

As the dispersant, for example, it is possible to use dispersants including a compound having a sulfonic acid structure such as a linear alkylbenzene sulfonate, a compound having an ester structure such as a diester compound, a ricinoleic acid alkyl ester, a phthalic acid ester, an adipic acid ester, a sebacic acid ester, or a phosphoric acid ester, a compound having an ether structure such as polyoxyethylene glycol, polyoxypropylene glycol, or alkylphenyl-polyoxyethylene-ether, a compound having a carboxylic acid structure such as polycarboxylic acid, a compound having an amine structure such as lauryl amine, dimethyl lauryl amine, oleyl propylene diamine, a secondary amine of polyoxyethylene, a tertiary amine of polyoxyethylene, or a diamine of polyoxyethylene, a compound having a polyamine structure such as polyalkylene polyamine alkylene oxide, a compound having an amide structure such as oleic acid diethanolamide or a fatty acid alkanolamide, and a compound having a high-molecular weight amide structure such as polyvinyl pyrrolidone or a polyester acid amidoamine salt. Furthermore, it is possible to use a high-molecular weight dispersant such as polyoxyethylene alkyl ether phosphoric acid (salt), a polymeric polycarboxylic acid, or a condensed ricinoleic acid ester. The high-molecular weight dispersant is defined as a dispersant having a molecular weight of equal to or greater than 10,000.

In a case where the aforementioned dispersant is formulated with the interlayer film, a lower limit and an upper limit of a content of the dispersant may be 1 part by weight and 50 parts by weight respectively with respect to 100 parts by weight of the lanthanoid complex having a halogen atom-containing bidentate ligand or the lanthanoid complex having a halogen atom-containing tridentate ligand in the interlayer film for laminated glass. In a case where the content of the dispersant is within the above range, the lanthanoid complex having a halogen atom-containing bidentate ligand or the lanthanoid complex having a halogen atom-containing tridentate ligand can be uniformly dispersed in the interlayer film for laminated glass. The lower limit and the upper limit of the content of the dispersant may be 3 parts by weight and 30 parts by weight respectively, or 5 parts by weight and 25 parts by weight respectively.

The interlayer film for laminated glass may further contain a UV absorber. In a case where the interlayer film for laminated glass contains the UV absorber, lightfastness of the interlayer film for laminated glass is improved.

An upper limit of a content of the UV absorber in the interlayer film for laminated glass may be 1 part by weight, 0.5 parts by weight, 0.2 parts by weight, or 0.1 parts by weight, with respect to 100 parts by weight of the aforementioned thermoplastic resin, because then an interlayer film for laminated glass that can display an image with higher contrast can be obtained.

Examples of the UV absorber include UV absorbers such as a compound having a malonic acid ester structure, a compound having an oxalic acid anilide structure, a compound having a benzotriazole structure, a compound having a benzophenone structure, a compound having a triazine structure, a compound having a benzoate structure, and a compound having a hindered amine structure.

The interlayer film for laminated glass may further contain a plasticizer.

The plasticizer is not particularly limited, and examples thereof include an organic ester plasticizer such as a monobasic organic acid ester or a polybasic organic acid ester, a phosphoric acid plasticizer such as an organic phosphoric acid plasticizer or an organic phosphorous acid plasticizer, and the like. The aforementioned plasticizer may be a liquid plasticizer.

The aforementioned monobasic organic acid ester is not particularly limited, and examples thereof include glycol esters, which are obtained through a reaction between a glycol such as triethylene glycol, tetraethylene glycol, or tripropylene glycol and a monobasic organic acid such as butyric acid, isobutyric acid, caproic acid, 2-ethylbutyric acid, heptanoic acid, n-octylic acid, 2-ethylhexanoic acid, pelargonic acid (n-nonylic acid), or decylic acid, and the like. Among these, triethylene glycol dicaproic acid ester, triethylene glycol di-2-ethylbutyric acid ester, triethylene glycol di-n-octylic acid ester, triethylene glycol di-2-ethylhexanoic acid ester, and the like may be suitable.

The aforementioned polybasic organic acid ester is not particularly limited, and examples thereof include ester compounds of a polybasic organic acid such as adipic acid, sebacic acid, or azelaic acid and an alcohol having a linear or branched structure containing 4 to 8 carbon atoms. Among these, dibutyl sebacic acid ester, dioctyl azelaic acid ester, dibutyl carbitol adipic acid ester, and the like may be suitable.

The aforementioned organic ester plasticizer is not particularly limited, and examples thereof include triethylene glycol di-2-ethylbutyrate, triethylene glycol di-2-ethylhexanoate, triethylene glycol dicaprylate, triethylene glycol di-n-octanoate, triethylene glycol di-n-heptanoate, tetraethylene glycol di-n-heptanoate, tetraethylene glycol di-2-ethylhexanoate, dibutyl sebacate, dioctyl azelate, dibutyl carbitol adipate, ethylene glycol di-2-ethylbutyrate, 1,3-propylene glycol di-2-ethylbutyrate, 1,4-butylene glycol di-2-ethylbutyrate, diethylene glycol di-2-ethylbutyrate, diethylene glycol di-2-ethylhexanoate, dipropylene glycol di-2-ethylbutyrate, triethylene glycol di-2-ethylpentanoate, tetraethylene glycol di-2-ethylbutyrate, diethylene glycol dicaprylate, dihexyl adipate, dioctyl adipate, hexyl cyclohexyl adipate, diisononyl adipate, heptyl nonyl adipate, dibutyl sebacate, an oil-modified sebacic acid alkyd, a mixture of a phosphoric acid ester and an adipic acid ester, an adipic acid ester, a mixed adipic acid ester prepared from an alkyl alcohol having 4 to 9 carbon atoms and a cyclic alcohol having 4 to 9 carbon atoms, an adipic acid ester having 6 to 8 carbon atoms such as hexyl adipate, and the like.

The aforementioned organic phosphoric acid plasticizer is not particularly limited, and examples thereof include tributoxyethyl phosphate, isodecyl phenyl phosphate, triisopropyl phosphate, and the like.

Among the above plasticizers, at least one or more kinds of plasticizer selected from dihexyl adipate (DHA), triethylene glycol di-2-ethylhexanoate (3GO), tetraethylene glycol di-2-ethylhexanoate (4GO), triethylene glycol di-2-ethylbutyrate (3GH), tetraethylene glycol di-2-ethylbutyrate (4GH), tetraethylene glycol di-n-heptanoate (4G7), and triethylene glycol di-n-heptanoate (3G7) may be used.

The interlayer film for laminated glass may contain, as the aforementioned plasticizer, triethylene glycol di-2-ethylhexanoate (3GO), triethylene glycol di-2-ethylbutyrate (3GH), tetraethylene glycol di-2-ethylhexanoate (4GO), or dihexyl adipate (DHA), because these plasticizers do not easily cause hydrolysis.

A content of the aforementioned plasticizer in the interlayer film for laminated glass is not particularly limited. A lower limit and an upper limit of the content of the plasticizer may be 30 parts by weight and 100 parts by weight respectively with respect to 100 parts by weight of the aforementioned thermoplastic resin. In a case where the content of the plasticizer is equal to or greater than 30 parts by weight, a melt viscosity of the interlayer film for laminated glass is reduced, and hence the interlayer film for laminated glass can be easily molded. In a case where the content of the plasticizer is equal to or less than 100 parts by weight, transparency of the interlayer film for laminated glass can be improved. The lower limit and the upper limit of the content of the plasticizer may be 35 parts by weight and 80 parts by weight respectively, 45 parts by weight and 70 parts by weight respectively, or 50 parts by weight and 63 parts by weight respectively.

The interlayer film for laminated glass may contain an antioxidant because then excellent lightfastness can be obtained.

The antioxidant is not particularly limited, and examples thereof include an antioxidant having a phenol structure, a sulfur-containing antioxidant, a phosphorus-containing antioxidant, and the like.

The antioxidant having a phenol structure is an antioxidant having a phenol skeleton. Examples of the antioxidant having a phenol structure include 2,6-di-t-butyl-p-cresol (BHT), butylated hydroxyanisole (BHA), 2,6-di-t-butyl-4-ethylphenol, stearyl-β-(3,5-di-t-butyl-4-hydroxyphenyl)propionate, 2,2'-methylenebis-(4-methyl-6-butylphenol), 2,2'-methylenebis-(4-ethyl-6-t-butylphenol), 4,4'-butylidene-bis-(3-methyl-6-t-butylphenol), 1,1,3-tris-(2-methyl-hydroxy-5-t-butylphenyl)butane, tetrakis[methylene-3-(3',5'-butyl-4-hydroxyphenyl)propionate]methane, 1,3,3-tris-(2-methyl-4-hydroxy-5-t-butylphenol)butane, 1,3,5-trimethyl-2,4,6-tris (3,5-di-t-butyl-4-hydroxybenzyl)benzene, bis(3,3'-t-butylphenol)butyric acid glycol ester, pentaerythritol tetrakis[3-(3,5-di-tert-butyl-4-hydroxyphenyl)propionate], and the like. One kind of these antioxidants may be used singly, or two or more kinds thereof may be used in combination.

If necessary, the interlayer film for laminated glass may contain additives such as a photostabilizer, an antistatic agent, a blue pigment, a blue dye, a green pigment, and a green dye.

The interlayer film for laminated glass may have a single layer structure consisting of only the aforementioned luminescent layer containing a luminescent material or a multilayer structure obtained by laminating other layers on the luminescent layer containing a luminescent material.

In a case where the interlayer film for laminated glass has a multilayer structure, the luminescent layer containing a luminescent material may be disposed on the entire surface or only a portion of the interlayer film for laminated glass. Alternatively, the luminescent layer may be disposed on the entire surface or only a portion of the interlayer film for laminated glass in a planar direction perpendicular to a thickness direction of the interlayer film for laminated glass. In a case where the luminescent layer containing a luminescent material is disposed on only a portion of the interlayer film for laminated glass, the portion can be used as a luminescent area and other portions can be used as a non-luminescent area such that information can be displayed only in the luminescent area.

In a case where the interlayer film for laminated glass has a multilayer structure, by adjusting constituents of the luminescent layer containing a luminescent material and constituents of other layers, various functions can be imparted to the obtained interlayer film for laminated glass.

For example, in order to impart sound insulating performance to the interlayer film for laminated glass, the content of the plasticizer in the luminescent layer containing a luminescent material with respect to 100 parts by weight of the thermoplastic resin (hereinafter, referred to as a content X as well) can be made greater than the content of the plasticizer in other layers with respect to 100 parts by weight of the thermoplastic resin (hereinafter, referred to as a content Y as well). In this case, the content X is greater than the content Y, for example, by equal to or greater than 5 parts by weight, by equal to or greater than 10 parts by weight, and by equal to or greater than 15 parts by weight. A difference between the content X and the content Y may be equal to or less than 50 parts by weight, equal to or less than 40 parts by weight, or equal to or less than 35 parts by weight, because then penetration resistance of the interlayer film for laminated glass is further improved. The difference between the content X and the content Y is calculated by (difference between content X and content Y)=(content X−content Y).

A lower limit and an upper limit of the content X may be 45 parts by weight and 80 parts by weight respectively, 50 parts by weight and 75 parts by weight respectively, or 55 parts by weight and 70 parts by weight respectively. In a case where the content X is set to be equal to or greater than the aforementioned lower limit, excellent sound insulating properties can be exhibited. In a case where the content X is set to be equal to or less than the aforementioned upper limit, it is possible to inhibit the occurrence of bleed out of the plasticizer and to prevent deterioration of transparency and adhesiveness of the interlayer film for laminated glass.

A lower limit and upper limit of the content Y may be 20 parts by weight and 45 parts by weight respectively, 30 parts by weight and 43 parts by weight respectively, or 35 parts by weight and 41 parts by weight respectively. In a case where the content Y is set to be equal to or greater than the aforementioned lower limit, high penetration resistance can be exhibited. In a case where the content Y is set to be equal to or less than the aforementioned upper limit, it is possible to inhibit the occurrence of bleed out of the plasticizer and to prevent deterioration of transparency and adhesiveness of the interlayer film for laminated glass.

In one or more embodiments, in order to impart sound insulating properties to the interlayer film for laminated glass, the thermoplastic resin in the aforementioned luminescent layer may be a polyvinyl acetal X. The polyvinyl acetal X can be prepared by acetalizing a polyvinyl alcohol by using an aldehyde. Generally, the polyvinyl alcohol is obtained by saponifying polyvinyl acetate. A lower limit and an upper limit of an average degree of polymerization of the polyvinyl alcohol may be 200 and 5,000 respectively. In a case where the average degree of polymerization of the polyvinyl alcohol is set to be equal to or greater than 200, penetration resistance of the obtained interlayer film for laminated glass can be improved. In a case where the average degree of polymerization of the polyvinyl alcohol is set to be equal to or less than 5,000, moldability of the luminescent layer can be secured. The lower limit and the upper limit of the average degree of polymerization of the polyvinyl alcohol may be 500 and 4,000 respectively. The average degree of polymerization of the polyvinyl alcohol is determined by a method based on JIS K6726 "Testing methods for polyvinyl alcohol".

A lower limit and an upper limit of the number of carbon atoms of the aldehyde, which is for acetalizing the polyvinyl alcohol, may be 4 and 6 respectively. In a case where the number of carbon atoms of the aldehyde is set to be equal to or greater than 4, it is possible to stably incorporate the plasticizer into the interlayer film for laminated glass in a sufficient amount and to demonstrate excellent sound insulating performance. Furthermore, bleed out of the plasticizer can be prevented. In a case where the number of carbon atoms of the aldehyde is set to be equal to or less than 6, the synthesis of the polyvinyl acetal X becomes easy, and hence productivity can be secured. The aldehyde having 4 to 6 carbon atoms may be a linear or branched aldehyde, and examples thereof include n-butyraldehyde, n-valeraldehyde, and the like.

An upper limit of an amount of hydroxyl groups in the polyvinyl acetal X may be 30 mol %. In a case where the amount of hydroxyl group in the polyvinyl acetal X is set to be equal to or less than 30 mol %, it is possible to incorporate the plasticizer into the interlayer film for laminated glass in an amount necessary for demonstrating sound insulating properties, and to prevent bleed out of the plasticizer. The upper limit of the amount of hydroxyl groups in the polyvinyl acetal X may be 28 mol %, 26 mol %, or 24 mol %. A lower limit of the amount of hydroxyl group in the polyvinyl acetal X may be 10 mol %, 15 mol %, or 20 mol %.

The amount of hydroxyl groups in the polyvinyl acetal X is a value obtained by expressing a molar fraction, which is determined by dividing an amount of ethylene groups to which a hydroxyl group is bonded by a total amount of ethylene groups in a main chain, as a percentage (mol %). The amount of ethylene groups to which a hydroxyl group is bonded can be determined by, for example, measuring the amount of ethylene groups in the polyvinyl acetal X, to which a hydroxyl group is bonded, by a method based on JIS K6728 "Testing methods for polyvinyl butyral".

A lower limit and an upper limit of an amount of acetal group in the polyvinyl acetal X may be 60 mol % and 85 mol % respectively. In a case where the amount of acetal groups in the polyvinyl acetal X is set to be equal to or greater than 60 mol %, it is possible to incorporate the plasticizer into the interlayer film for laminated glass in an amount necessary for exhibiting sound insulating properties by increasing hydrophobicity of the luminescent layer, and to prevent bleed out or whitening of the plasticizer. In a case where the amount of acetal group in the polyvinyl acetal X is set to be equal to or less than 85 mol %, the synthesis of the polyvinyl acetal X becomes easier, and hence productivity can be secured. The lower limit of the amount of acetal groups in the polyvinyl acetal X may be 65 mol %, or equal to or greater than 68 mol %.

By a method based on JIS K6728 "Testing methods for polyvinyl butyral", the amount of acetal groups can be determined by measuring the amount of ethylene groups in the polyvinyl acetal X, to which the acetal groups are bonded.

A lower limit and an upper limit of an amount of acetyl group in the polyvinyl acetal X may be 0.1 mol % and 30 mol % respectively. In a case where the amount of acetyl groups in the polyvinyl acetal X is set to be equal to or greater than 0.1 mol %, it is possible to incorporate the plasticizer into the interlayer film for laminated glass in an amount necessary for exhibiting sound insulating properties, and to prevent bleed out. In a case where the amount of acetyl group in the polyvinyl acetal X is set to be equal to or less than 30 mol %, it is possible to prevent whitening by increasing hydrophobicity of the luminescent layer. The lower limit of the amount of acetyl groups in the polyvinyl acetal X may be 1 mol %, 5 mol %, or 8 mol %. The upper limit of the amount of acetyl group in the polyvinyl acetal X may be 25 mol %, or 20 mol.

The amount of acetyl groups is a value obtained by determining a molar fraction by dividing a value, which is obtained by subtracting an amount of ethylene groups to which an acetal group is bonded and an amount of ethylene groups to which a hydroxyl group is bonded from a total amount of ethylene groups on a main chain, by the total amount of ethylene groups on the main chain and expressing the molar fraction by percentage (mol %).

Particularly, the polyvinyl acetal X may be a polyvinyl acetal in which the amount of acetyl groups is equal to or greater than 8 mol % or a polyvinyl acetal in which the amount of acetyl groups is less than 8 mol % and the amount of acetal groups is equal to or greater than 65 mol %, because then it is possible to easily incorporate the plasticizer into the luminescent layer in an amount necessary for exhibiting sound insulating properties. The polyvinyl acetal X may be polyvinyl acetal in which the amount of acetyl group is equal to or greater than 8 mol % or polyvinyl acetal in which the amount of acetyl groups is less than 8 mol % and the amount of acetal groups is equal to or greater than 68 mol %.

In one or more embodiments, in order to impart sound insulating properties to the interlayer film for laminated glass, the thermoplastic resin in other layers described above may be a polyvinyl acetal Y. It is possible that the amount of hydroxyl groups is greater in the polyvinyl acetal Y than in the polyvinyl acetal X.

The polyvinyl acetal Y can be prepared by acetalizing a polyvinyl alcohol by using an aldehyde. Generally, the polyvinyl alcohol is obtained by saponifying polyvinyl acetate. A lower limit and an upper limit of an average degree of polymerization of the polyvinyl alcohol may be 200 and 5,000 respectively. In a case where the average degree of polymerization of the polyvinyl alcohol is set to be equal to or greater than 200, penetration resistance of the interlayer film for laminated glass can be improved. In a case where the average degree of polymerization of the polyvinyl alcohol is set to be equal to or less than 5,000, moldability of other layers can be secured. The lower limit and the upper limit of the average degree of polymerization of the polyvinyl alcohol may be 500 and 4,000 respectively.

A lower limit and an upper limit of the number of carbon atoms of the aldehyde, which is for acetalizing the aforementioned polyvinyl alcohol, may be 3 and 4 respectively. In a case where the number of carbon atoms of the aldehyde is set to be equal to or greater than 3, penetration resistance of the interlayer film for laminated glass can be improved. In a case where the number of carbon atoms of the aldehyde is set to be equal to or less than 4, productivity of the polyvinyl acetal Y is improved. The aldehyde having 3 or 4 carbon atoms may be a linear or branched aldehyde, and examples thereof include n-butyraldehyde and the like.

An upper limit and a lower limit of an amount of hydroxyl groups in the polyvinyl acetal Y may be 33 mol % and 28 mol % respectively. In a case where the amount of hydroxyl groups in the polyvinyl acetal Y is set to be equal to or less than 33 mol %, whitening of the interlayer film for laminated glass can be prevented. In a case where the amount of hydroxyl groups in the polyvinyl acetal Y is set to be equal to or greater than 28 mol %, penetration resistance of the interlayer film for laminated glass can be improved.

A lower limit and an upper limit of the amount of acetal groups in the polyvinyl acetal Y may be 60 mol % and 80 mol % respectively. In a case where the amount of acetal groups is set to be equal to or greater than 60 mol %, it is possible to incorporate the plasticizer into the interlayer film for laminated glass in an amount necessary for exhibiting sufficient penetration resistance. In a case where the amount of acetal groups is set to be equal to or less than 80 mol %, adhesion between the aforementioned other layers and the glass can be secured. The lower limit and the upper limit of the amount of acetal groups in the polyvinyl acetal Y may be 65 mol % and 69 mol % respectively.

An upper limit of an amount of acetyl groups in the polyvinyl acetal Y may be 7 mol %. In a case where the amount of acetyl groups in the polyvinyl acetal Y is set to be equal to or less than 7 mol %, it is possible to prevent whitening by increasing hydrophobicity of other layers. The upper limit of the amount of acetyl groups in the polyvinyl acetal Y may be 2 mol %, and a lower limit of the amount of acetyl groups in the polyvinyl acetal Y may be 0.1 mol %.

The amount of hydroxyl groups, the amount of acetal groups, and the amount of acetyl groups in the polyvinyl acetal Y can be measured by the same method as used for the polyvinyl acetal X.

Furthermore, for example, in order to impart heat shielding performance to the interlayer film for laminated glass, a heat radiation absorber can be contained in any one layer or any two layers among the aforementioned luminescent layer containing a luminescent material and other layers or in all of the luminescent layer containing a luminescent material and other layers.

The heat radiation absorber is not particularly limited as long as it has infrared ray-shielding performance. As the heat radiation absorber, at least one kind of particles selected from the group consisting of tin-doped indium oxide (ITO) particles, antimony-doped tin oxide (ATO) particles, aluminum-doped zinc oxide (AZO) particles, indium-doped zinc oxide (IZO) particles, tin-doped zinc oxide particles, silicon-doped zinc oxide particles, lanthanum hexaboride particles, and cerium hexaboride particles may be suitable.

A thickness of the interlayer film for laminated glass is not particularly limited. A lower limit and an upper limit of the thickness thereof may be 50 μm and 1,700 μm respectively, or 100 m and 1,000 μm respectively. The upper limit of the thickness of the interlayer film for laminated glass may be 900 μm. The lower limit of the thickness of the interlayer film for laminated glass means a thickness of the thinnest portion in the interlayer film for laminated glass, and the upper limit of the thickness of the interlayer film for laminated glass means a thickness of the thickest portion in the interlayer film for laminated glass.

In a case where the interlayer film for laminated glass has a multilayer structure, a thickness of the aforementioned luminescent layer containing a luminescent material is not particularly limited. A lower limit and an upper limit of the thickness of the luminescent layer may be 50 μm and 1,000 μm respectively. In a case where the thickness of the luminescent layer containing a luminescent material is within the above range, light is emitted with sufficiently high contrast when the interlayer film for laminated glass is irradiated with light rays having a specific wavelength. The lower limit and the upper limit of the thickness of the luminescent layer containing a luminescent material may be 80 μm and 500 μm respectively, or 90 μm and 300 μm respectively.

In one or more embodiments, the interlayer film for laminated glass may have a wedge-like cross sectional shape. In a case where the cross sectional shape of the interlayer film for laminated glass is in the form of a wedge, by adjusting a wedge angle θ of the wedge according to a mounting angle of the laminated glass, image display can be performed with preventing the occurrence of a double image. From the viewpoint of further inhibiting a double image, a lower limit of the wedge angle θ may be 0.1 mrad, 0.2 mrad, or 0.3 mrad, and an upper limit of the wedge angle θ may be 1 mrad or 0.9 mrad. For example, in a case where an interlayer film for laminated glass having a wedge-like cross sectional shape is manufactured by a method of extrusion-molding a resin composition by using an extruder, in some cases, the interlayer film for laminated glass has a shape in which an area slightly distant from one end of a thin side toward the inside (specifically, provided that a distance between one end and the other end is X, an area 0X to 0.2X distant from one end of a thin side toward the inside) has a minimum thickness and an area slightly distant from one end of a thick side toward the inside (specifically, provided that a distance between one end and the other end is X, an area 0X to 0.2X distant from one end of a thick side toward the inside) has a maximum thickness. In the present specification, the aforementioned shape is also included in a wedge shape.

In one or more embodiments, in a case where the interlayer film for laminated glass has a wedge-like cross sectional shape, it is possible that the interlayer film for laminated glass has a multilayer structure including the luminescent layer and other layers (hereinafter, referred to as a "shape-adjusting layers" in some cases). By controlling the thickness of the luminescent layer such that it is within a certain range and laminating the shape-adjusting layers, the overall cross sectional shape of the interlayer film for laminated glass can be adjusted to become a wedge shape having a certain wedge angle. Shape-adjusting layers may be laminated only on one surface or both surfaces of the luminescent layer. Furthermore, a plurality of shape-adjusting layers may be laminated.

The aforementioned luminescent layer may have a wedge-like or rectangular cross sectional shape. A difference between the maximum thickness and the minimum thickness of the luminescent layer may be equal to or less than 100 μm. In this way, an image can be displayed at a luminance within a certain range. The difference between the maximum thickness and the minimum thickness of the luminescent layer may be equal to or less than 95 μm, or equal to or less than 90 μm.

In one or more embodiments, in a case where the interlayer film for laminated glass has a wedge-like cross sectional shape, a thickness of the luminescent layer is not particularly limited. A lower limit and an upper limit of the thickness of the luminescent layer may be 50 μm and 700 μm respectively. In a case where the thickness of the luminescent layer is within the above range, an image with sufficiently high contrast can be displayed. The lower limit and the upper limit of the thickness of the luminescent layer may be 70 μm and 400 μm respectively, or 80 μm and 150 μm respectively. The lower limit of the thickness of the luminescent layer means a thickness of the thinnest portion in the luminescent layer, and the upper limit of the thickness of the luminescent layer means a thickness of the thickest portion in the luminescent layer.

By being laminated on the luminescent layer, the shape-adjusting layer plays a role of adjusting the overall cross sectional shape of the interlayer film for laminated glass such that the cross sectional shape thereof becomes a wedge shape having a certain wedge angle. A cross sectional shape of the shape-adjusting layer may be in the form of a wedge, triangle, trapezoid, or rectangle. In a case where the shape-adjusting layer having a wedge-like cross sectional shape, a triangular cross sectional shape, or a trapezoidal cross sectional shape is laminated, the overall cross sectional shape of the interlayer film for laminated glass can be adjusted to become a wedge shape having a certain wedge angle. Furthermore, the overall cross sectional shape of the interlayer film for laminated glass may be adjusted by combining a plurality of shape-adjusting layers.

A thickness of the shape-adjusting layer is not particularly limited. From the viewpoint of practicality and from the viewpoint of sufficiently improving adhesion and penetration resistance, a lower limit and an upper limit of the thickness of the shape-adjusting layer may be 10 μm and 1,000 μm respectively, or 200 μm and 800 μm respectively. The lower limit of the thickness of the shape-adjusting layer may be 300 μm. The lower limit of the thickness of the shape-adjusting layer means a thickness of the thinnest portion in the shape-adjusting layer, and the upper limit of the thickness of the shape-adjusting layer means a thickness of the thickest portion in the shape-adjusting layer. In a case where a plurality of shape-adjusting layers is used in combination, the thickness of the shape-adjusting layer means a total thickness thereof.

FIGS. 1 to 3 are schematic views illustrating an example of an aspect in which the interlayer film for laminated glass according to one or more embodiments of the present invention has a wedge-like cross sectional shape. In FIGS. 1 to 3, for the sake of convenience of illustration, the thickness of the interlayer film for laminated glass, the thickness of each layer constituting the interlayer film for laminated glass, or the wedge angle θ is shown differently from the actual thicknesses and wedge angle.

FIG. 1 shows a cross section of an interlayer film for laminated glass 1 taken along a thickness direction thereof. The interlayer film for laminated glass 1 has a double layer structure in which a shape-adjusting layer 12 is laminated on one surface of a luminescent layer 11 containing a luminescent material. While the luminescent layer 11 has a rectangular shape, the shape-adjusting layer 12 has a wedge-like shape, a triangular shape, or a trapezoidal shape. As a result, the interlayer film for laminated glass 1 overall has a wedge shape in which a wedge angle θ is 0.1 to 1 mrad.

FIG. 2 shows a cross section of an interlayer film for laminated glass 2 taken along a thickness direction thereof. The interlayer film for laminated glass 2 has a three-layer structure in which a shape-adjusting layer 22 and a shape-adjusting layer 23 are laminated on both surfaces of a luminescent layer 21 containing a luminescent material. While each of the luminescent layer 21 and the shape-adjusting layer 23 is a rectangle having a constant thickness, the shape-adjusting layer 22 has a wedge shape, a triangular shape, or a trapezoidal shape. As a result, the interlayer film for laminated glass 2 overall has a wedge shape in which a wedge angle θ is 0.1 to 1 mrad.

FIG. 3 shows a cross section of an interlayer film for laminated glass 3 taken along a thickness direction thereof. The interlayer film for laminated glass 3 has a three-layer structure in which a shape-adjusting layer 32 and a shape-adjusting layer 33 are laminated on both surfaces of a luminescent layer 31 containing a luminescent material. The luminescent layer 31 has a gentle wedge shape in which a difference between a maximum thickness and a minimum thickness is equal to or less than 100 μm, and the shape-adjusting layers 32 and 33 having a wedge shape are laminated thereon. As a result, the interlayer film for laminated glass 3 overall has a wedge shape in which a wedge angle θ is 0.1 to 1 mrad.

A method for manufacturing the aforementioned interlayer film for laminated glass is not particularly limited. For example, a plasticizer solution containing a plasticizer and a luminescent material is thoroughly mixed with a thermoplastic resin, thereby preparing a resin composition for forming an interlayer film for laminated glass. Then, by extruding the resin composition for forming an interlayer film for laminated glass by using an extruder, an interlayer film for laminated glass can be manufactured.

The aforementioned laminated glass is obtained by laminating the aforementioned interlayer film for laminated glass between a pair of glass plates.

For the glass plates, generally used transparent plate glass can be used. Examples thereof include inorganic glass such as float plate glass, polished plate glass, figured glass, wired glass, wired plate glass, tinted plate glass, heat absorbing glass, heat reflecting glass, and green glass. Furthermore, UV shielding glass obtained by forming a UV shielding coating layer on a surface of glass can also be used, and this glass may be used for a glass plate on the side opposite to a side which is irradiated with light rays having a specific wavelength. For the aforementioned glass plates, an organic plastic plate such as polyethylene terephthalate, polycarbonate, and polyacrylate can also be used.

As the aforementioned glass plates, two or more kinds of glass plate may be used. For example, it is possible to use laminated glass in which the aforementioned interlayer film for laminated glass is laminated between transparent float plate glass and a tinted glass plate such as green glass. As the aforementioned glass plates, two or more kinds of glass plate having different thicknesses may also be used.

The aforementioned irradiation device is a device radiating light rays to the aforementioned laminated glass, and an output of the radiated light rays is equal to or less than 1 mW. In a case where the output is equal to or less than 1 mW, the radiated light is safe even if it is transmitted through the interlayer film for laminated glass and directly observed by a human being. An upper limit of the output of the radiated light rays may be 0.9 mW, 0.8 mW, or 0.7 mW.

A lower limit of the output of the radiated light rays is not particularly limited as long as it is enough for enabling the laminated glass to emit light at a luminance of equal to or greater than 1 cd/m$^2$. The lower limit of the output may be 0.1 mW, 0.2 mW, or 0.4 mW.

The output of the radiated light rays can be measured by measuring an irradiation intensity by using a laser power meter (for example, "BeamTrack power measurement sensor 3A-QUAD" manufactured by Ophir Japan Ltd.) disposed in a position 10 cm distant from a light source.

A lower limit and an upper limit of a density of the radiated light rays may be 0.1 mW/cm$^2$ and 550 mW/cm$^2$ respectively. In a case where the density of the radiated light rays is equal to or greater than 0.1 mW/cm$^2$, luminescent display during nighttime can be sufficiently visually recognized, and in a case where the density of the radiated light rays is equal to or less than 550 mW/cm$^2$, a difference in luminance between the light rays and the surroundings during nighttime does not cause an unpleasant feeling. The lower limit and the upper limit of the density of the radiated light rays may be 0.2 mW/cm$^2$ and 530 mW/cm$^2$ respectively, 0.3 mW/cm$^2$ and 500 mW/cm$^2$ respectively, or 0.4 mW/cm$^2$ and 450 mW/cm$^2$ respectively.

The density of the radiated light rays can be measured by measuring a cumulative UV dose per unit area by using a cumulative UV meter (for example, "UIT-250" manufactured by USHIO INC.) disposed in a position 10 cm distant from a light source.

A lower limit and an upper limit of an irradiation diameter of the radiated light rays may be 0.005 cmϕ and 3 cmϕ respectively. In a case where the irradiation diameter of the radiated light rays is equal to or greater than 0.005 cmϕ, the emitted light can be visually recognized, and in a case where the irradiation diameter is equal to or less than 3 cmϕ, display can be performed with excellent contrast. The lower limit and the upper limit of the irradiation diameter of the radiated light rays may be 0.01 cmϕ and 2.5 cmϕ respectively, 0.03 cmϕ and 2 cmϕ respectively, or 0.05 cmϕ and 1 cmϕ respectively.

The irradiation diameter of the radiated light rays can be calculated according to the ISO11146 standards based on measurement results obtained by a CCD sensor and a CMOS sensor (for example, a "USB 2.0 beam diagnostic camera Laser Cam HR" manufactured by Coherent Japan Inc.) disposed in a position 10 cm distant from a light source.

Examples of the aforementioned irradiation device include a spot light source ("LC-8" or the like manufactured by Hamamatsu Photonics K.K.), a xenon flash lamp ("CW lamp" or the like manufactured by Heraeus Holding), a black light ("Carry hand" manufactured by IUCHI SEIEIDO CO., LTD.), and the like.

In one or more embodiments, when the irradiation device of the display apparatus irradiates the laminated glass with light rays, the laminated glass emits light at a luminance of equal to or greater than 1 cd/m$^2$. Even when being irradiated with low-intensity light rays having an output of equal to or less than 1 mW, the laminated glass emits light at a luminance of equal to or greater than 1 cd/m$^2$. Therefore, display can be performed with sufficient contrast, and even if a human being directly observes the light rays transmitted through the interlayer film for laminated glass, the human being is not dazzled.

The luminance of the laminated glass may be measured using a wavelength at which the aforementioned luminescent material emits light with a maximum intensity at a wavelength of equal to or greater than 400 nm or using a wavelength of 405 nm, and may be measured using a wavelength of 405 nm.

The display apparatus according to one or more embodiments of the present invention can be used for nightvision.

The display apparatus according to one or more embodiments of the present invention can be used in a windshield of vehicles.

Advantageous Effects of Invention

According to one or more embodiments of the present invention, it is possible to provide a display apparatus from which a predetermined initial luminance is obtained even in a case where the apparatus is irradiated with low-intensity light rays, an interlayer film for laminated glass, and laminated glass.

DESCRIPTION OF EMBODIMENTS

Figure 1:
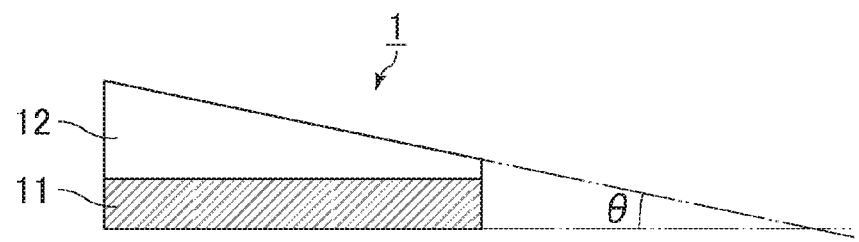
FIG. 1 is a schematic view illustrating an example of an interlayer film for laminated glass according to one or more embodiments of the present invention that has a wedge-like cross sectional shape.
Figure 2:
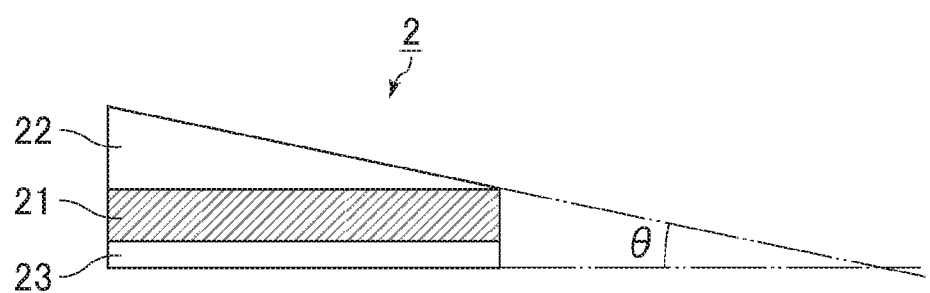
FIG. 2 is a schematic view illustrating an example of an interlayer film for laminated glass according to one or more embodiments of the present invention that has a wedge-like cross sectional shape.
Figure 3:
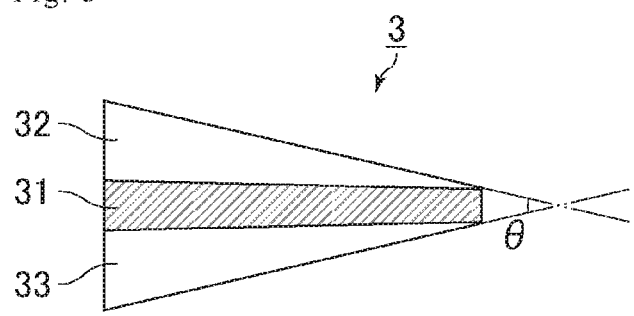
FIG. 3 is a schematic view illustrating an example of an interlayer film for laminated glass according to one or more embodiments of the present invention that has a wedge-like cross sectional shape.

Hereinafter, one or more embodiments of the present invention will be more specifically described based on examples, but the present invention is not limited to the examples.

Example 1

(1) Preparation of Eu(TFA)$_3$phen 12.5 mmol of europium acetate (Eu(CH$_3$COO)$_3$) was dissolved in 50 mL of distilled water, and 33.6 mmol of trifluoroacetyl acetone (TFA, CH$_3$COCH$_2$COCF$_3$) was added thereto, followed by stirring for 3 hours at room temperature. The precipitated solid was filtered, rinsed, and then recrystallized using methanol and distilled water, thereby obtaining Eu(TFA)$_3$(H$_2$O)$_2$. 5.77 g of the obtained complex Eu(TFA)$_3$(H$_2$O)$_2$ and 2.5 g of 1,10-phenanthroline (phen) were dissolved in 100 mL of methanol and heated under reflux for 12 hours. After 12 hours, methanol was removed by being distilled away under reduced pressure, thereby obtaining a white product. The powder was washed with toluene, unreacted raw materials were removed by suction filtration, and then toluene was distilled away under reduced pressure, thereby obtaining a powdery material. Recrystallization was performed using a mixed solvent of toluene and hexane, thereby obtaining Eu (TFA)$_3$phen.

(2) Preparation of Polyvinyl Butyral 1

A 2 m$^3$ reactor equipped with a stirrer was filled with 1,700 kg of a 7.5% by mass aqueous solution of PVA (degree of polymerization: 1,700, degree of saponification: 99 mol %), 74.6 kg of n-butyraldehyde, and 0.13 kg of 2,6-di-t-butyl-4-methylphenol, and the resultant was cooled to 14° C. as a whole. 99.44 L of nitric acid having a concentration of 30% by mass was added thereto such that butyralization of PVA was started. 10 minutes after the end of the addition of nitric acid, the temperature started to be increased up to 65° C. for 90 minutes, and then the reaction was further performed for 120 minutes. Then, the reaction solution was cooled to room temperature, and the precipitated solid was filtered and then washed 10 times with deionized water in an amount of 10 times as much as the amount of the solid contents in terms of mass. Thereafter, the solid was thoroughly neutralized using a 0.3% by mass aqueous sodium hydrogen carbonate solution, washed 10 times with deionized water in an amount of 10 times as much as the amount of the solid contents in terms of mass, and dehydrated and dried, thereby obtaining a polyvinyl butyral resin 1 (PVB1).

(3) Manufacturing Interlayer Film for Laminated Glass and Laminated Glass 0.2 parts by weight of the obtained Eu(TFA)$_3$phen was added to 40 parts by weight of triethylene glycol di-2-ethylhexanoate (3GO), thereby preparing a luminescent plasticizer solution. The entirety of the obtained plasticizer solution and 100 parts by weight of the obtained polyvinyl butyral 1 were thoroughly kneaded together by using a mixing roll, thereby preparing a resin composition.

The obtained resin composition was extruded using an extruder, thereby obtaining an interlayer film for laminated glass (thickness: 760 μm).

For the obtained interlayer film for laminated glass, a total content of sodium, potassium, and magnesium was measured using an ICP emission spectrometer ("ICPE-9000" manufactured by Shimadzu Corporation). As a result, it was confirmed that the total content was equal to or less than 50 ppm.

The obtained interlayer film for laminated glass was laminated between a pair of clear glass (thickness: 2.5 mm) having a size of 5 cm (length)×5 cm (width), thereby obtaining a laminate. In a state of being kept at 90° C. for 30 minutes in a vacuum laminator, the obtained laminate was pressure-bonded by being subjected to vacuum pressing. After pressure bonding, the laminate was further pressure-bonded for 20 minutes by using an autoclave under conditions of 140° C. and 14 MPa, thereby obtaining laminated glass.

(4) Manufacturing Display Apparatus

The obtained laminated glass was combined with, as an irradiation device, a mercury light source ("REX-250" manufactured by Asahi Spectra Co., Ltd.) for which an output of light rays was set to be 0.4 mW, a wavelength of light rays was set to be 405 nm, an irradiation diameter was set to be 0.05 cmϕ, and a density of light rays was set to be 204 mW/cm$^2$ by the output adjustment of the light source, a dedicated band path filter ("LX0405" manufactured by Asahi Spectra Co., Ltd.), a rod lens (manufactured by Asahi Spectra Co., Ltd.), and fiber (manufactured by Asahi Spectra Co., Ltd.), thereby obtaining a display apparatus.

Example 2

(1) Preparation of Tb(TFA)$_3$phen 12.5 mmol of terbium acetate (Tb(CH$_3$COO)$_3$) was dissolved in 50 mL of distilled water, and 33.6 mmol of trifluoroacetyl acetone (TFA, CH$_3$COCH$_2$COCF$_3$) was added thereto, followed by stirring for 3 hours at room temperature. The precipitated solid was filtered, rinsed, and then recrystallized using methanol and distilled water, thereby obtaining Tb(TFA)$_3$(H$_2$O)$_2$. 5.77 g of the obtained complex Tb(TFA)$_3$(H$_2$O)$_2$ and 2.5 g of 1,10-phenanthroline (phen) were dissolved in 100 mL of methanol and heated under reflux for 12 hours. After 12 hours, methanol was removed by being distilled away under reduced pressure, thereby obtaining a white product. The powder was washed with toluene, unreacted raw materials were removed by suction filtration, and then toluene was distilled away under reduced pressure, thereby obtaining a powdery material. Recrystallization was performed using a mixed solvent of toluene and hexane, thereby obtaining Tb (TFA)$_3$phen.

(2) Manufacturing Interlayer Film for Laminated Glass, Laminated Glass, and Display Apparatus An interlayer film for laminated glass and laminated glass were prepared in the same manner as in Example 1, except that Eu(TFA)$_3$phen was changed to the obtained Tb (TFA)$_3$phen. Furthermore, a display apparatus was manufactured in the same manner as in Example 1, except that the irradiation device was adjusted such that an output of light rays became 0.4 mW, a wavelength of light rays became 405 nm, an irradiation diameter became 0.05 cmϕ, and a density of light rays became 204 mW/cm$^2$ by the output adjustment of the light source, a dedicated band path filter ("LX0405" manufactured by Asahi Spectra Co., Ltd.), a rod lens (manufactured by Asahi Spectra Co., Ltd.), and fiber (manufactured by Asahi Spectra Co., Ltd.).

Comparative Example 1

A display apparatus was manufactured in the same manner as in Example 1, except that the irradiation device was adjusted such that an output of light rays became 10 mW, a wavelength of light rays became 405 nm, an irradiation diameter became 0.05 cmϕ, and a density of light rays became 50,955 mW/cm$^2$ by the output adjustment of the light source, a dedicated band path filter ("LX0405" manufactured by Asahi Spectra Co., Ltd.), a rod lens (manufactured by Asahi Spectra Co., Ltd.), and fiber (manufactured by Asahi Spectra Co., Ltd.).

Reference Example 1

An interlayer film for laminated glass and laminated glass were prepared in the same manner as in Example 1, except that Eu(TFA)$_3$phen was changed to naphthalimide (4,5-dimethyloxy-N-(2-ethyloxyl)naphthalimide). Furthermore, a display apparatus was manufactured in the same manner as in Example 1, except that the irradiation device was adjusted such that an output of light rays became 0.4 mW, a wavelength of light rays became 405 nm, an irradiation diameter became 0.05 cmφ, and a density of light rays became 204 mW/cm² by the output adjustment of the light source, a dedicated band path filter ("LX0405" manufactured by Asahi Spectra Co., Ltd.), a rod lens (manufactured by Asahi Spectra Co., Ltd.), and fiber (manufactured by Asahi Spectra Co., Ltd.).

Example 3

(1) Preparation of Eu(HFA)$_3$phen 3.38 g (12.5 mmol) of europium acetate (Eu(CH$_3$COO)$_3$) was dissolved in 50 mL of distilled water, and 7.00 g (33.6 mmol) of hexafluoroacetone (HFA, CF$_3$COCH$_2$COCF$_3$) was added thereto, followed by stirring for 3 hours at room temperature. The precipitated solid was filtered, rinsed, and then recrystallized using methanol and distilled water, thereby obtaining Eu(HFA)$_3$(H$_2$O)$_2$. 7.20 g of the obtained complex Eu(HFA)$_3$(H$_2$O)$_2$ and 2.5 g of 1,10-phenanthroline (phen) were dissolved in 100 mL of methanol and heated under reflux for 12 hours. After 12 hours, methanol was removed by being distilled away under reduced pressure, thereby obtaining a white product. The powder was washed with toluene, unreacted raw materials were removed by suction filtration, and then toluene was distilled away under reduced pressure, thereby obtaining a powdery material. Recrystallization was performed using a mixed solvent of toluene and hexane, thereby obtaining Eu(HFA)$_3$phen.

(2) Manufacturing Interlayer Film for Laminated Glass, Laminated Glass, and Display Apparatus An interlayer film for laminated glass and laminated glass were prepared in the same manner as in Example 1, except that Eu(TFA)$_3$phen was changed to the obtained Eu(HFA)$_3$phen. Furthermore, a display apparatus was manufactured in the same manner as in Example 1, except that the irradiation device was adjusted such that an output of light rays became 1 mW, a wavelength of light rays became 405 nm, an irradiation diameter became 0.05 cmφ, and a density of light rays became 509 mW/cm² by the output adjustment of the light source, a dedicated band path filter ("LX0405" manufactured by Asahi Spectra Co., Ltd.), a rod lens (manufactured by Asahi Spectra Co., Ltd.), and fiber (manufactured by Asahi Spectra Co., Ltd.).

Examples 4 to 6

An interlayer film for laminated glass, laminated glass, and a display apparatus were manufactured in the same manner as in Example 3, except that the content of Eu(HFA)$_3$phen was changed to the values shown in Table 2, and the output of light rays, the irradiation diameter, and the density of light rays of the irradiation device were changed to the values shown in Table 2.

Example 7

(1) Preparation of Tb(HFA)$_3$phen 3.46 g (12.5 mmol) of terbium acetate (Tb(CH$_3$COO)$_3$) was dissolved in 50 mL of distilled water, and 7.00 g (33.6 mmol) of hexafluoroacetyl acetone (HFA, CF$_3$COCH$_2$COCF$_3$) was added thereto, followed by stirring for 3 hours at room temperature. The precipitated solid was filtered, rinsed, and then recrystallized using methanol and distilled water, thereby obtaining Tb(HFA)$_3$(H$_2$O)$_2$. 7.26 g of the obtained complex Tb(HFA)$_3$(H$_2$O)$_2$ and 2.5 g of 1,10-phenanthroline (phen) were dissolved in 100 mL of methanol and heated under reflux for 12 hours. After 12 hours, methanol was removed by being distilled away under reduced pressure, thereby obtaining a white product. The powder was washed with toluene, unreacted raw materials were removed by suction filtration, and then toluene was distilled away under reduced pressure, thereby obtaining a powdery material. Recrystallization was performed using a mixed solvent of toluene and hexane, thereby obtaining Tb(HFA)$_3$phen.

(2) Manufacturing Interlayer Film for Laminated Glass, Laminated Glass, and Display Apparatus An interlayer film for laminated glass and laminated glass were prepared in the same manner as in Example 1, except that Eu(TFA)$_3$phen was changed to the obtained Tb(HFA)$_3$phen. Furthermore, a display apparatus was manufactured in the same manner as in Example 1, except that the irradiation device was adjusted such that an output of light rays became 1 mW, a wavelength of light rays became 365 nm, an irradiation diameter became 0.05 cmφ, and a density of light rays became 509 mW/cm² by the output adjustment of the light source, a dedicated band path filter ("LX0405" manufactured by Asahi Spectra Co., Ltd.), a rod lens (manufactured by Asahi Spectra Co., Ltd.), and fiber (manufactured by Asahi Spectra Co., Ltd.).

Examples 8 to 10

An interlayer film for laminated glass, laminated glass, and a display apparatus were manufactured in the same manner as in Example 7, except that the formulation amount of Tb(HFA)$_3$phen was changed to the values shown in Table 2, and the output of the light rays, the irradiation diameter, and the density of light rays of the irradiation device were changed to the values shown in Table 2.

Example 11

An interlayer film for laminated glass and laminated glass were prepared in the same manner as in Example 1, except that Eu(TFA)$_3$phen was changed to diethyl-2,5-dihydroxyterephthalate ("diethyl 2,5-dihydroxyterephthalate" manufactured by Sigma-Aldrich Co., LLC.). Furthermore, a display apparatus was manufactured in the same manner as in Example 1, except that the irradiation device was adjusted such that an output of light rays became 1 mW, a wavelength of light rays became 405 nm, an irradiation diameter became 0.05 cmφ, and a density of light rays became 509 mW/cm² by the output adjustment of the light source, a dedicated band path filter ("LX0405" manufactured by Asahi Spectra Co., Ltd.), a rod lens (manufactured by Asahi Spectra Co., Ltd.), and fiber (manufactured by Asahi Spectra Co., Ltd.).

Examples 12 to 14

An interlayer film for laminated glass, laminated glass, and a display apparatus were manufactured in the same manner as in Example 11, except that the content of diethyl-2,5-dihydroxyterephthalate was changed to the values shown in Tables 2 and 3, and the output of the light rays, the irradiation diameter, and the density of light rays of the irradiation device were changed to the values shown in Tables 2 and 3.

Comparative Examples 2 to 10

An interlayer film for laminated glass, laminated glass, and a display apparatus were manufactured in the same manner as in Example 1, except that the type of the luminescent material, the content of the luminescent material, and the output, the wavelength, the irradiation diameter, and the density of the light rays of the irradiation device were changed as shown in Table 3.

Example 15

(1) Manufacturing Interlayer Film for Laminated Glass and Laminated Glass 0.2 parts by weight of Eu(HFA)$_3$phen obtained in Example 3 and 0.2 parts by weight of 2-(2'-hydroxy-3'-t-butyl-5-methylphenyl)-5-chlorobenzotriazole ("Tinuvin 326" manufactured by BASF SE) as a UV absorber were added to 40 parts by weight of triethylene glycol di-2-ethylhexanoate (3GO), thereby preparing a luminescent plasticizer solution. The entirety of the obtained plasticizer solution and 100 parts by weight of the obtained polyvinyl butyral 1 were thoroughly kneaded together by using a mixing roll, thereby preparing a resin composition.

The obtained resin composition was extruded using an extruder, thereby obtaining an interlayer film for laminated glass (thickness: 760 μm).

For the obtained interlayer film for laminated glass, a total content of sodium, potassium, and magnesium was measured using an ICP emission spectrometer ("ICPE-9000" manufactured by Shimadzu Corporation). As a result, it was confirmed that the total content was 0 ppm.

The obtained interlayer film for laminated glass was laminated between a pair of clear glass (thickness: 2.5 mm) having a size of 5 cm (length)×5 cm (width), thereby obtaining a laminate. In a state of being kept at 90° C. in a vacuum laminator for 30 minutes, the obtained laminate was pressure-bonded by being subjected to vacuum pressing. After pressure bonding, the laminate was further pressure-bonded for 20 minutes by using an autoclave under conditions of 140° C. and 14 MPa, thereby obtaining laminated glass.

(2) Manufacturing Display Apparatus

The obtained laminated glass was combined with, as an irradiation device, a mercury light source ("REX-250" manufactured by Asahi Spectra Co., Ltd.) for which an output of light rays was set to be 1 mW, a wavelength of light rays was set to be 405 nm, an irradiation diameter was set to be 0.05 cmφ, and a density of light rays was set to be 509 mW/cm$^2$ by the output adjustment of the light source, a dedicated band path filter ("LX0405" manufactured by Asahi Spectra Co., Ltd.), a rod lens (manufactured by Asahi Spectra Co., Ltd.), and fiber (manufactured by Asahi Spectra Co., Ltd.), thereby obtaining a display apparatus.

Examples 16 and 17

An interlayer film for laminated glass, laminated glass, and a display apparatus were manufactured in the same manner as in Example 15, except that the type of the luminescent material, the content of the luminescent material, and the wavelength of the light rays of the irradiation device were changed as shown in Table 4.

Example 18

(1) Preparation of Resin Compositions for First and Second Resin Layers 40 parts by weight of triethylene glycol di-2-ethylhexanoate (3GO) and 100 parts by weight of polyvinyl butyral 1 were thoroughly kneaded together by using a mixing roll, thereby preparing a resin composition for first and second resin layers.

(2) Preparation of Resin Composition for Luminescent Layer

A 2 m$^3$ reactor equipped with a stirrer was filled with 1,700 kg of a 7.5% by mass aqueous solution of polyvinyl alcohol (degree of polymerization: 2,400, degree of saponification: 88 mol %), 119.4 kg of n-butyraldehyde, and 0.13 kg of 2,6-di-t-butyl-4-methylphenol, and the resultant was cooled to 14° C. as a whole. 99.44 L of nitric acid having a concentration of 30% by mass was added thereto such that butyralization of PVA was started. 10 minutes after the end of the addition of nitric acid, the temperature started to be increased up to 65° C. for 90 minutes, and then the reaction was further performed for 120 minutes. Then, the reaction solution was cooled to room temperature, and the precipitated solid content was filtered and then washed 10 times with deionized water in an amount of 10 times as much as the amount of the solid contents in terms of mass (washing before neutralization). Thereafter, the solid content was thoroughly neutralized by using a 0.3% by mass aqueous sodium hydrogen carbonate solution, washed 10 times with deionized water in an amount of 10 times as much as the amount of the solid contents in terms of mass (washing after neutralization), and dehydrated and dried, thereby obtaining polyvinyl butyral 2 (hereinafter, referred to as "PVB2" as well). In PVB2, an amount of acetyl groups was 12 mol %, an amount of butyral groups was 65 mol %, and an amount of hydroxyl groups was 23 mol %. 0.5 parts by weight of Eu(HFA)$_3$phen obtained in Example 3 was added to 60 parts by weight of triethylene glycol di-2-ethylhexanoate (3GO), thereby preparing a luminescent plasticizer solution. The entirety of the obtained plasticizer solution and 100 parts by weight of the polyvinyl butyral 2 were thoroughly kneaded together by using a mixing roll, thereby preparing a resin composition for a luminescent layer.

(3) Manufacturing Interlayer Film for Laminated Glass and Laminated Glass

The resin composition for a luminescent layer and the resin composition for the first and second resin layers were co-extruded using a co-extruder, thereby obtaining an interlayer film for laminated glass in which the first resin layer, the luminescent layer, and the second resin layer were laminated in this order. The luminescent layer had a thickness of 100 μm, and each of the first and second resin layers had a thickness of 350 μm. Therefore, a thickness of the interlayer film for laminated glass was 800 μm, and all of the layers had a rectangular shape.

The obtained interlayer film for laminated glass was laminated between a pair of clear glass (thickness: 2.5 mm) having a size of 5 cm (length)×5 cm (width), thereby obtaining a laminate. In a state of being kept at 90° C. for 30 minutes in a vacuum laminator, the obtained laminate was pressure-bonded by being subjected to vacuum pressing. After pressure bonding, the laminate was further pressure-bonded for 20 minutes by using an autoclave under conditions of 140° C. and 14 MPa, thereby obtaining laminated glass.

(4) Manufacturing Display Apparatus

The obtained laminated glass was combined with, as an irradiation device, a mercury light source ("REX-250" manufactured by Asahi Spectra Co., Ltd.) for which an output of light rays was set to be 1 mW, a wavelength of light rays was set to be 405 nm, an irradiation diameter was set to be 0.05 cmφ, and a density of light rays was set to be 509 mW/cm$^2$ by the output adjustment of the light source, a dedicated band path filter ("LX0405" manufactured by Asahi Spectra Co., Ltd.), a rod lens (manufactured by Asahi Spectra Co., Ltd.), and fiber (manufactured by Asahi Spectra Co., Ltd.), thereby obtaining a display apparatus.

Examples 19 and 20

An interlayer film for laminated glass, laminated glass, and a display apparatus were manufactured in the same manner as in Example 18, except that the type of the luminescent material and the wavelength of the light rays of the irradiation device were changed as shown in Table 5.

Example 21

(1) Manufacturing Interlayer Film for Laminated Glass and Laminated Glass

The resin composition for a luminescent layer and the resin composition for the first and second resin layers obtained in Example 18 were co-extruded using a co-extruder, thereby obtaining an interlayer film for laminated glass in which the first resin layer, the luminescent layer, and the second resin layer were laminated in this order. At this time, the shape of a die of the co-extruder was changed so as to obtain a rectangular luminescent layer which had a thickness of 100 μm, a wedge-shaped first resin layer in which a thick portion had a thickness of 600 μm and a thin portion had a thickness of 350 μm, and a wedge-shaped second resin layer in which a thick portion had a thickness of 600 μm and a thin portion had a thickness of 350 μm. Herein, the shortest distance between one end and the other end, which were in a direction perpendicular to the extrusion direction of the obtained interlayer film, of the interlayer film for laminated glass was measured. As a result, it was confirmed that the shortest distance was 1 m.

An interlayer film having a size of 5 cm (length)×5 cm (width) was cut off from the obtained interlayer film for laminated glass, such that, within the shortest distance between one end and the other end, which were in a direction perpendicular to the extrusion direction of the obtained interlayer film for laminated glass, a point 5 cm distant from one end of the thin side of the interlayer film for laminated glass became the center. The obtained interlayer film having a size of 5 cm (length)×5 cm (width) was laminated between a pair of clear glass (thickness: 2.5 mm) having a size of 5 cm (length)×5 cm (width), thereby obtaining a laminate. In a state of being kept at 90° C. for 30 minutes in a vacuum laminator, the obtained laminate was pressure-bonded by being subjected to vacuum pressing. After pressure bonding, the laminate was further pressure-bonded for 20 minutes by using an autoclave under conditions of 140° C. and 14 MPa, thereby obtaining laminated glass.

(2) Manufacturing Display Apparatus

The obtained laminated glass was combined with, as an irradiation device, a mercury light source ("REX-250" manufactured by Asahi Spectra Co., Ltd.) for which an output of light rays was set to be 1 mW, a wavelength of light rays was set to be 405 nm, an irradiation diameter was set to be 0.05 cmϕ, and a density of light rays was set to be 509 mW/cm² by the output adjustment of the light source, a dedicated band path filter ("LX0405" manufactured by Asahi Spectra Co., Ltd.), a rod lens (manufactured by Asahi Spectra Co., Ltd.), and fiber (manufactured by Asahi Spectra Co., Ltd.), thereby obtaining a display apparatus.

Examples 22 and 23

An interlayer film for laminated glass, laminated glass, and a display apparatus were manufactured in the same manner as in Example 21, except that the type of the luminescent material and the wavelength of the light rays of the irradiation device were changed as shown in Table 5.

Example 24

(1) Preparation of Resin Composition for First and Second Luminescent Layers 0.22 parts by weight of Eu(HFA)₃phen obtained in Example 3 was added to 40 parts by weight of triethylene glycol di-2-ethylhexanoate (3GO), thereby preparing a luminescent plasticizer solution. The entirety of the obtained plasticizer solution and 100 parts by weight of the obtained polyvinyl butyral 1 were thoroughly kneaded together by using a mixing roll, thereby preparing a resin composition for first and second luminescent layers.

(2) Preparation of Resin Composition for Non-Luminescent Layer 60 parts by weight of triethylene glycol di-2-ethylhexanoate (3GO) and 100 parts by weight of the polyvinyl butyral 2 were thoroughly kneaded together by using a mixing roll, thereby obtaining a resin composition for a non-luminescent layer.

(3) Manufacturing Interlayer Film for Laminated Glass and Laminated Glass

The resin composition for a non-luminescent layer and the resin composition for the first and second luminescent layers were co-extruded using a co-extruder, thereby obtaining an interlayer film for laminated glass in which the first luminescent layer, the non-luminescent layer, and the second luminescent layer were laminated in this order. The non-luminescent layer had a thickness of 100 μm, and each of the first and second luminescent layers had a thickness of 350 μm. Therefore, the interlayer film for laminated glass had a thickness of 800 μm, and all of the layers had a rectangular shape.

The obtained interlayer film for laminated glass was laminated between a pair of clear glass (thickness: 2.5 mm) having a size of 5 cm (length)×5 cm (width). In a state of being kept at 90° C. for 30 minutes in a vacuum laminator, the obtained laminate was pressure-bonded by being subjected to vacuum pressing. After pressure bonding, the laminate was further pressure-bonded for 20 minutes by using an autoclave under conditions of 140° C. and 14 MPa, thereby obtaining laminated glass.

(4) Manufacturing Display Apparatus

The obtained laminated glass was combined with, as an irradiation device, a mercury light source ("REX-250" manufactured by Asahi Spectra Co., Ltd.) for which an output of light rays was set to be 1 mW, a wavelength of light rays was set to be 405 nm, an irradiation diameter was set to be 0.05 cmϕ, and a density of light rays was set to be 509 mW/cm² by the output adjustment of the light source, a dedicated band path filter ("LX0405" manufactured by Asahi Spectra Co., Ltd.), a rod lens (manufactured by Asahi Spectra Co., Ltd.), and fiber (manufactured by Asahi Spectra Co., Ltd.), thereby obtaining a display apparatus.

Examples 25 and 26

An interlayer film for laminated glass, laminated glass, and a display apparatus were manufactured in the same manner as in Example 24, except that the type of the luminescent material and the wavelength of the light rays of the irradiation device were changed as shown in Table 6.

Example 27

(1) Manufacturing Interlayer Film for Laminated Glass and Laminated Glass

The resin composition for a non-luminescent layer and the resin composition for the first and second luminescent layers obtained in Example 24 were co-extruded using a co-extruder, thereby obtaining an interlayer film for laminated glass in which the first luminescent layer, the non-luminescent layer, and the second luminescent layer were laminated in this order. At this time, the shape of a die of the co-extruder was changed so as to obtain a rectangular non-luminescent layer which had a thickness of 100 μm, a wedge-shaped first luminescent layer in which a thick portion had a thickness of 600 μm and a thin portion had a thickness of 350 μm, and a wedge-shaped second luminescent layer in which a thick portion had a thickness of 600 μm and a thin portion had a thickness of 350 μm. Herein, the shortest distance between one end and the other end, which were in a direction perpendicular to the extrusion direction of the obtained interlayer film, of the interlayer film was measured. As a result, it was confirmed that the shortest distance was 1 m.

An interlayer film having a size of 5 cm (length)×5 cm (width) was cut off from the obtained interlayer film for laminated glass, such that, within the shortest distance between one end and the other end, which were in a direction perpendicular to the extrusion direction of the interlayer film for laminated glass, a point 5 cm distant from one end of the thin side of the interlayer film for laminated glass became the center. The obtained interlayer film having a size of 5 cm (length)×5 cm (width) was laminated between a pair of clear glass (thickness: 2.5 mm) having a size of 5 cm (length)×5 cm (width), thereby obtaining a laminate. In a state of being kept at 90° C. for 30 minutes in a vacuum laminator, the obtained laminate was pressure-bonded by being subjected to vacuum pressing. After pressure bonding, the laminate was further pressure-bonded for 20 minutes by using an autoclave under conditions of 140° C. and 14 MPa, thereby obtaining laminated glass.

(2) Manufacturing Display Apparatus

The obtained laminated glass was combined with, as an irradiation device, a mercury light source ("REX-250" manufactured by Asahi Spectra Co., Ltd.) for which an output of light rays was set to be 1 mW, a wavelength of light rays was set to be 405 nm, an irradiation diameter was set to be 0.05 cmϕ, and a density of light rays was set to be 509 mW/cm² by the output adjustment of the light source, a dedicated band path filter ("LX0405" manufactured by Asahi Spectra Co., Ltd.), a rod lens (manufactured by Asahi Spectra Co., Ltd.), and fiber (manufactured by Asahi Spectra Co., Ltd.), thereby obtaining a display apparatus.

Examples 28 and 29

An interlayer film for laminated glass, laminated glass, and a display apparatus were manufactured in the same manner as in Example 27, except that the type of the luminescent material and the wavelength of the light rays of the irradiation device were changed as shown in Table 6.

(Evaluation)

For the laminated glass obtained in examples and comparative examples, the luminance and safety thereof at the time when the laminated glass was irradiated with light rays were evaluated by the following methods.

The results are shown in Tables 1 to 6.

(1) Evaluation of Luminance

The 5 cm (length)×5 cm (width) laminated glass obtained in Examples 1 to 29 and Comparative Examples 1 to 9 was disposed in a dark room, and each of the irradiation devices of Examples 1 to 29 and Comparative Examples 1 to 9 was disposed in a position 10 cm distant from the laminated glass in a direction perpendicular to the surface of the laminated glass. Then, a luminance meter ("SR-3AR" manufactured by TOPCON TECHNOHOUSE CORPORATION) was disposed on the side irradiated with light, in a position in which the shortest distance between the surface of the laminated glass and the luminance meter became 35 cm, at an angle of 45° with respect to the surface of the laminated glass irradiated with light. Thereafter, by irradiating the laminated glass with light from the irradiation device, the luminance of the laminated glass was measured.

The luminance was measured before and after the laminated glass was thermally treated at 100° C. for 4 weeks.

Furthermore, the luminance was measured in the central portion and at the edge (portion 2 cm distant from the end of a sample) of the laminated glass.

Regarding the initial luminance of the laminated glass, in a case where the initial luminance measured in the central portion and at the edge was equal to or greater than 5 cd/m², the laminated glass was evaluated to be "OO"; in a case where the initial luminance was equal to or greater than 1 cd/m² and less than 5 cd/m², the laminated glass was evaluated to be "O"; and in a case where the initial luminance was less than 1 cd/m², the laminated glass was evaluated to be "X".

Regarding the heat resistance of the laminated glass, in a case where an absolute value of an amount of change of luminance measured in the central portion and at the edge before and after the thermal treatment performed at 100° C. for 4 weeks was equal to or less than 5 cd/m², the laminated glass was evaluated to be "O"; and in a case where the absolute value of the amount of change of luminance was greater than 5 cd/m², the laminated glass was evaluated to be "X". For laminated glass in which the initial luminance was less than 5 cd/m², heat resistance was not evaluated.

The output of the radiated light rays was obtained by calculation according to the ISO 11146 standards based on measurement results obtained by measuring irradiation intensity by using a laser power meter ("BeamTrack power measurement sensor 3A-QUAD" manufactured by Ophir Japan Ltd.) disposed in a position 10 cm distant from a light source. The density of the radiated light rays was obtained by calculation according to the ISO 11146 standards based on measurement results obtained by measuring a cumulative UV dose per unit area by using an cumulative UV meter ("UIT-250" manufactured by USHIO INC.) disposed in a position 10 cm distant from a light source. The irradiation diameter of the radiated light rays was obtained by calculation according to the ISO 11146 standards based on measurement results obtained using a CCD sensor and a CMOS sensor (a "USB 2.0 beam diagnostic camera Laser Cam HR" manufactured by Coherent Japan Inc.) disposed in a position 10 cm distant from a light source.

(2) Nightvision Evaluation

Each of the display apparatuses obtained in examples and comparative examples was caused to stand in a dark room and operated. An observer was caused to stand on the same side as the light source such that the observer's eyes were in a position 1 m distant from an image formed on the display apparatus. The operating display apparatus was observed by 20 observers. In a case where 15 or more observers answered that they easily observed the image, the display apparatus was evaluated to be "OO"; in a case where the number of observers answered as above was equal to or greater than 10 and less than 15, the display apparatus was evaluated to be "O"; and in a case where the number of observers answered as above was less than 10, the display apparatus was evaluated to be "X". In this way, nightvision performance was evaluated.

(3) Evaluation of Safety

Regarding the safety of the display apparatus, in a case where the output of the light rays radiated from the irradiation device was equal to or less than 1 mW, the display apparatus was evaluated to be "O", and in a case where the output of the light rays was greater than 1 mW, the display apparatus was evaluated to be "X".

TABLE 1

|  |  |  |  | Example 1 | Example 2 | Comparative Example 1 | Reference Example 1 |
|---|---|---|---|---|---|---|---|
| Polyvinyl butyral |  |  | Part by weight | 100 | 100 | 100 | 100 |
| Plasticizer (3GO) |  |  | Part by weight | 40 | 40 | 40 | 40 |
| Luminescent material | Eu(TFA)$_3$phen |  | Part by weight | 0.2 | — | 0.2 | — |
|  | Tb(TFA)$_3$phen |  | Part by weight | — | 0.2 | — | — |
|  | Naphthalimide |  | Part by weight | — | — | — | 0.2 |
| Light rays | Output |  | mW | 0.4 | 0.4 | 10 | 0.4 |
|  | Irradiation diameter |  | cmφ | 0.05 | 0.05 | 0.05 | 0.05 |
|  | Density |  | mW/cm$^2$ | 204 | 204 | 50,955 | 204 |
| Evaluation | Evaluation of luminance | Laminated glass Central portion | Initial luminance (cd/m$^2$) | 11 | 30 | 150 | 460 |
|  |  |  | Luminance after 4 W at 100° C. (cd/m$^2$) | 10.5 | 28 | — | 445 |
|  |  |  | Heat resistance (Δluminance) (cd/m$^2$) | 0.5 | 2 | — | 15 |
|  |  |  | Evaluation of initial luminance | ⊚ | ⊚ | ⊚ | ⊚ |
|  |  |  | Evaluation of heat resistance | ○ | ○ | — | X |
|  |  | Laminated glass Edge | Initial luminance (cd/m$^2$) | 11 | 30 | 150 | 460 |
|  |  |  | Luminance after 4 W at 100° C. (cd/m$^2$) | 10.9 | 29 | — | 480 |
|  |  |  | Heat resistance (Δluminance) (cd/m$^2$) | 0.1 | 1 | — | −20 |
|  |  |  | Evaluation of initial luminance | ⊚ | ⊚ | ⊚ | ⊚ |
|  |  |  | Evaluation of heat resistance | ○ | ○ | — | X |
|  | Evaluation of nightvision |  |  | ⊚ | ⊚ | ⊚ | ○ |
|  | Evaluation of safety |  |  | ○ | ○ | X | ○ |

TABLE 2

|  |  |  |  | Example 3 | Example 4 | Example 5 | Example 6 | Example 7 |
|---|---|---|---|---|---|---|---|---|
| Polyvinyl butyral |  |  | Part by weight | 100 | 100 | 100 | 100 | 100 |
| Plasticizer (3GO) |  |  | Part by weight | 40 | 40 | 40 | 40 | 40 |
| Luminescent material | Eu(HFA)$_3$phen |  | Part by weight | 0.2 | 0.2 | 0.4 | 0.2 | — |
|  | Tb(HFA)$_3$phen |  | Part by weight | — | — | — | — | 0.2 |
|  | Diethyl 2,5-dihydroxyterephthalate |  | Part by weight | — | — | — | — | — |
|  | Naphthalimide |  | Part by weight | — | — | — | — | — |
| Light rays | Wavelength |  | nm | 405 | 405 | 405 | 405 | 405 |
|  | Output |  | mW | 1 | 0.1 | 1 | 1 | 1 |
|  | Irradiation diameter |  | cmφ | 0.05 | 0.05 | 0.05 | 3 | 0.05 |
|  | Density |  | mW/cm$^2$ | 509 | 50.9 | 509 | 0.14 | 509 |
| Evaluation | Evaluation of luminance | Laminated glass Central portion | Initial luminance (cd/m$^2$) | 30 | 10 | 60 | 8 | 80 |
|  |  |  | Luminance after 4 W at 100° C. (cd/m$^2$) | 28 | 8 | 58 | 7 | 78 |
|  |  |  | Heat resistance (Δluminance) (cd/m$^2$) | 2 | 2 | 2 | 1 | 2 |
|  |  |  | Evaluation of initial luminance | ⊚ | ⊚ | ⊚ | ⊚ | ⊚ |
|  |  |  | Evaluation of heat resistance | ○ | ○ | ○ | ○ | ○ |
|  |  | Laminated glass Edge | Initial luminance (cd/m$^2$) | 32 | 12 | 63 | 10 | 83 |
|  |  |  | Luminance after 4 W at 100° C. (cd/m$^2$) | 30 | 11 | 60 | 8 | 80 |
|  |  |  | Heat resistance (Δluminance) (cd/m$^2$) | 2 | 1 | 3 | 2 | 3 |
|  |  |  | Evaluation of initial luminance | ⊚ | ⊚ | ⊚ | ⊚ | ⊚ |
|  |  |  | Evaluation of heat resistance | ○ | ○ | ○ | ○ | ○ |
|  | Evaluation of nightvision |  |  | ⊚ | ⊚ | ⊚ | ⊚ | ⊚ |
|  | Evaluation of safety |  |  | ○ | ○ | ○ | ○ | ○ |

|  |  |  | Example 8 | Example 9 | Example 10 | Example 11 | Example 12 |
|---|---|---|---|---|---|---|---|
| Polyvinyl butyral |  | Part by weight | 100 | 100 | 100 | 100 | 100 |
| Plasticizer (3GO) |  | Part by weight | 40 | 40 | 40 | 40 | 40 |
| Luminescent material | Eu(HFA)$_3$phen | Part by weight | — | — | — | — | — |
|  | Tb(HFA)$_3$phen | Part by weight | 0.2 | 0.4 | 0.2 | — | — |

TABLE 2-continued

|  |  |  |  |  |  |  |  |  |
|---|---|---|---|---|---|---|---|---|
|  | Diethyl 2,5-dihydroxyterephthalate |  | Part by weight | — | — | — | 0.2 | 0.2 |
|  | Naphthalimide |  | Part by weight | — | — | — | — | — |
| Light rays | Wavelength |  | nm | 405 | 405 | 405 | 405 | 405 |
|  | Output |  | mW | 0.1 | 1 | 1 | 1 | 0.1 |
|  | Irradiation diameter |  | cmφ | 0.05 | 0.05 | 3 | 0.05 | 0.05 |
|  | Density |  | mW/cm² | 50.9 | 509 | 0.14 | 509 | 50.9 |
| Evaluation | Evaluation of luminance | Laminated glass Central portion | Initial luminance cd/m² | 25 | 160 | 20 | 400 | 110 |
|  |  |  | Luminance after 4 W at 100° C. cd/m² | 22 | 158 | 18 | 401 | 112 |
|  |  |  | Heat resistance (Δluminance) cd/m² | 3 | 2 | 2 | −1 | −2 |
|  |  |  | Evaluation of initial luminance | ◯◯ | ◯◯ | ◯◯ | ◯◯ | ◯◯ |
|  |  |  | Evaluation of heat resistance | ◯ | ◯ | ◯ | ◯ | ◯ |
|  |  | Laminated glass Edge | Initial luminance cd/m² | 28 | 162 | 21 | 395 | 115 |
|  |  |  | Luminance after 4 W at 100° C. cd/m² | 25 | 158 | 19 | 398 | 118 |
|  |  |  | Heat resistance (Δluminance) cd/m² | 3 | 4 | 2 | −3 | −3 |
|  |  |  | Evaluation of initial luminance | ◯◯ | ◯◯ | ◯◯ | ◯◯ | ◯◯ |
|  |  |  | Evaluation of heat resistance | ◯ | ◯ | ◯ | ◯ | ◯ |
|  | Evaluation of nightvision |  | — | ◯◯ | ◯ | ◯◯ | ◯ | ◯◯ |
|  | Evaluation of safety |  | — | ◯ | ◯ | ◯ | ◯ | ◯ |

TABLE 3

|  |  |  |  | Example 13 | Example 14 | Comparative Example 2 | Comparative Example 3 | Comparative Example 4 | Comparative Example 5 |
|---|---|---|---|---|---|---|---|---|---|
| Polyvinyl butyral |  |  | Part by weight | 100 | 100 | 100 | 100 | 100 | 100 |
| Plasticizer (3GO) |  |  | Part by weight | 40 | 40 | 40 | 40 | 40 | 40 |
| Luminescent material | Eu(HFA)₃phen |  | Part by weight | — | — | — | 0.002 | — | — |
|  | Tb(HFA)₃phen |  | Part by weight | — | — | — | — | 0.002 | — |
|  | Diethyl 2,5-dihydrozyterephthalate |  | Part by weight | 0.4 | 0.2 | — | — | — | 0.002 |
|  | Naphthalimide |  | Part by weight | — | — | — | — | — | — |
| Light rays | Wavelength |  | nm | 405 | 405 | 405 | 405 | 405 | 405 |
|  | Output |  | mW | 1 | 1 | 1 | 1 | 1 | 1 |
|  | Irradiation diameter |  | cmφ | 0.05 | 3 | 0.05 | 0.05 | 0.05 | 0.05 |
|  | Density |  | mW/cm² | 509 | 0.14 | 509 | 509 | 509 | 509 |
| Evaluation | Evaluation of luminance | Laminated glass Central portion | Initial luminance cd/m² | 650 | 50 | 0 | 0.01 | 0.02 | 0.07 |
|  |  |  | Luminance after 4 W at 100° C. cd/m² | 651 | 54 | — | — | — | — |
|  |  |  | Heat resistance (Δluminance) cd/m² | −1 | −4 | — | — | — | — |
|  |  |  | Evaluation of initial luminance | ◯◯ | ◯◯ | X | X | X | X |
|  |  |  | Evaluation of heat resistance | ◯ | ◯ | — | — | — | — |
|  |  | Laminated glass Edge | Initial luminance cd/m² | 655 | 55 | 0 | 0.02 | 0.03 | 0.08 |
|  |  |  | Luminance after 4 W at 100° C. cd/m² | 656 | 58 | — | — | — | — |
|  |  |  | Heat resistance (Δluminance) cd/m² | −1 | −3 | — | — | — | — |
|  |  |  | Evaluation of initial luminance | ◯◯ | ◯◯ | X | X | X | X |

TABLE 3-continued

|  |  |  |  |  |  |  |  |
|---|---|---|---|---|---|---|---|
| Evaluation of heat resistance |  | — | ○ | ○ | — | — | — | — |
| Evaluation of nightvision |  | — | ○ | ○○ | X | X | X | X |
| Evaluation of safety |  | — | ○ | ○ | ○ | ○ | ○ | ○ |

| | | | Comparative Example 6 | Comparative Example 7 | Comparative Example 8 | Comparative Example 9 | Comparative Example 10 |
|---|---|---|---|---|---|---|---|
| Polyvinyl butyral | | Part by weight | 100 | 100 | 100 | 100 | 100 |
| Plasticizer (3GO) | | Part by weight | 40 | 40 | 40 | 40 | 40 |
| Luminescent material | Eu(HFA)$_3$phen | Part by weight | 0.2 | — | — | 0.2 | 0.2 |
| | Tb(HFA)$_3$phen | Part by weight | — | 0.2 | — | — | — |
| | Diethyl 2,5-dihydrozyterephthalate | Part by weight | — | — | 0.2 | — | — |
| | Naphthalimide | Part by weight | — | — | — | — | — |
| Light rays | Wavelength | nm | 405 | 405 | 405 | 405 | 405 |
| | Output | mW | 1 | 1 | 1 | 1.5 | 2 |
| | Irradiation diameter | cmφ | 10 | 10 | 10 | 0.05 | 0.05 |
| | Density | mW/cm$^2$ | 0.013 | 0.013 | 0.013 | 754 | 1020 |
| Evaluation | Evaluation of luminance | Laminated glass Central portion | | | | | |
| | | Initial luminance (cd/m$^2$) | 0.01 | 0.03 | 0.04 | 50 | 62 |
| | | Luminance after 4 W at 100° C. (cd/m$^2$) | — | — | — | 48 | 59 |
| | | Heat resistance (Δluminance) (cd/m$^2$) | — | — | — | 2 | 3 |
| | | Evaluation of initial luminance | X | X | X | ○○ | ○○ |
| | | Evaluation of heat resistance | — | — | — | ○ | ○ |
| | Laminated glass Edge | Initial luminance (cd/m$^2$) | 0.01 | 0.03 | 0.05 | 52 | 65 |
| | | Luminance after 4 W at 100° C. (cd/m$^2$) | — | — | — | 50 | 62 |
| | | Heat resistance (Δluminance) (cd/m$^2$) | — | — | — | 2 | 3 |
| | | Evaluation of initial luminance | X | X | X | ○○ | ○○ |
| | | Evaluation of heat resistance | — | — | — | ○ | ○ |
| | Evaluation of nightvision | | X | X | X | ○○ | ○○ |
| | Evaluation of safety | | ○ | ○ | ○ | X | X |

TABLE 4

| | | | Example 15 | Example 16 | Example 17 |
|---|---|---|---|---|---|
| Polyvinyl butyral | | Part by weight | 100 | 100 | 100 |
| Plasticizer (3GO) | | Part by weight | 40 | 40 | 40 |
| Luminescent material | Eu(HFA)$_3$phen | Part by weight | 0.2 | — | — |
| | Tb(HFA)$_3$phen | Part by weight | — | 0.2 | — |
| | Diethyl 2,5-dihydroxyterephthalate | Part by weight | — | — | 0.2 |
| | Naphthalimide | Part by weight | — | — | — |
| UV absorbing material | Tinuvin 326 | Part by weight | 0.2 | 0.2 | 0.2 |
| Light rays | Wavelength | nm | 405 | 405 | 405 |
| | Output | mW | 1 | 1 | 1 |

TABLE 4-continued

|  |  |  |  |  | Example 15 | Example 16 | Example 17 |
|---|---|---|---|---|---|---|---|
|  |  |  | Irradiation diameter | cmφ | 0.05 | 0.05 | 0.05 |
|  |  |  | Density | mW/cm² | 509 | 509 | 509 |
| Evaluation | Evaluation of luminance | laminated glass Central portion | Initial luminance | cd/m² | 26 | 77 | 398 |
|  |  |  | Luminance after 4 W at 100° C. | cd/m² | 24 | 75 | 400 |
|  |  |  | Heat resistance (Δluminance) | cd/m² | 2 | 2 | −2 |
|  |  |  | Evaluation of initial luminance | — | ⊙○ | ⊙○ | ⊙○ |
|  |  |  | Evaluation of heat resistance | — | ○ | ○ | ○ |
|  |  | Laminated glass Edge | Initial luminance | cd/m² | 28 | 80 | 400 |
|  |  |  | Luminance after 4 W at 100° C. | cd/m² | 26 | 77 | 402 |
|  |  |  | Heat resistance (Δluminance) | cd/m² | 2 | 3 | −2 |
|  |  |  | Evaluation of initial luminance | — | ⊙○ | ⊙○ | ⊙○ |
|  |  |  | Evaluation of heat resistance | — | ○ | ○ | ○ |
|  | Evaluation of nightvision |  |  | — | ⊙○ | ⊙○ | ○ |
|  | Evaluation of safety |  |  | — | ○ | ○ | ○ |

TABLE 5

|  |  |  |  | Example 18 | Example 19 | Example 20 |
|---|---|---|---|---|---|---|
| First resin layer | Polyvinyl butyral |  | Part by weight | 100 | 100 | 100 |
|  | Plasticizer (3GO) |  | Part by weight | 40 | 40 | 40 |
|  | Shape |  | — | Rectangle | Rectangle | Rectangle |
|  | Thickness of first resin layer (thick portion) |  | μm | 350 | 350 | 350 |
|  | Thickness of first resin layer (thin portion) |  | μm | 350 | 350 | 350 |
| Luminescent layer (layer 1) | Polyvinyl butyral |  | Part by weight | 100 | 100 | 100 |
|  | Plasticizer (3GO) |  | Part by weight | 60 | 60 | 60 |
|  | Luminescent material | Eu(HFA)₃phen | Part by weight | 0.5 | — | — |
|  |  | Tb(HFA)₃phen | Part by weight | — | 0.5 | — |
|  |  | Diethyl 2,5-dihydroxyterephthalate | Part by weight | — | — | 0.5 |
|  |  | Naphthalimide | Part by weight | — | — | — |
|  | Film thickness |  | μm | 100 | 100 | 100 |
| Second resin layer | Polyvinyl butyral |  | Part by weight | 100 | 100 | 100 |
|  | Plasticizer (3GO) |  | Part by weight | 40 | 40 | 40 |
|  | Shape |  | — | Rectangle | Rectangle | Rectangle |
|  | Thickness of second resin layer (thick portion) |  | μm | 350 | 350 | 350 |
|  | Thickness of second resin layer (thin portion) |  | μm | 350 | 350 | 350 |
| Film shape | Shape |  | — | Rectangle | Rectangle | Rectangle |
|  | Laminated structure |  | — | First resin layer/ luminescent layer/second resin layer | First resin layer/ luminescent layer/second resin layer | First resin layer/ luminescent layer/second resin layer |
|  | Wedge angle |  | mrad | 0 | 0 | 0 |
|  | Total film thickness (thick portion) |  | μm | 800 | 800 | 800 |
|  | Total film thickness (thin portion) |  | μm | 800 | 800 | 800 |
| Light rays | Wavelength |  | nm | 405 | 405 | 405 |
|  | Output |  | mW | 1 | 1 | 1 |
|  | Irradiation diameter |  | cmφ | 0.05 | 0.05 | 0.05 |
|  | Density |  | mW/cm² | 509 | 509 | 509 |

TABLE 5-continued

| Evaluation | Evaluation of luminance | Laminated glass Central portion | Initial luminance | cd/m² | 15 | 30 | 140 |
|---|---|---|---|---|---|---|---|
| | | | Luminance after 4 W at 100° C. | cd/m² | 12 | 27 | 141 |
| | | | Heat resistance (Δluminance) | cd/m² | 3 | 3 | −1 |
| | | | Evaluation of initial luminance | — | ◯◯ | ◯◯ | ◯◯ |
| | | | Evaluation of heat resistance | — | ◯ | ◯ | ◯ |
| | | Laminated glass Edge | Initial luminance | cd/m² | 18 | 33 | 145 |
| | | | Luminance after 4 W at 100° C. | cd/m² | 14 | 29 | 148 |
| | | | Heat resistance (Δluminance) | cd/m² | 4 | 4 | −3 |
| | | | Evaluation of initial luminance | — | ◯◯ | ◯◯ | ◯◯ |
| | | | Evaluation of heat resistance | — | ◯ | ◯ | ◯ |
| | Evaluation of nightvision | | | — | ◯◯ | ◯◯ | ◯◯ |
| | Evaluation of safety | | | — | ◯ | ◯ | ◯ |

|  |  |  |  | | Example 21 | Example 22 | Example 23 |
|---|---|---|---|---|---|---|---|
| First resin layer | Polyvinyl butyral | | | Part by weight | 100 | 100 | 100 |
| | Plasticizer (3GO) | | | Part by weight | 40 | 40 | 40 |
| | Shape | | | — | Wedge | Wedge | Wedge |
| | Thickness of first resin layer (thick portion) | | | μm | 350 | 350 | 350 |
| | Thickness of first resin layer (thin portion) | | | μm | 600 | 600 | 600 |
| Luminescent layer (layer 1) | Polyvinyl butyral | | | Part by weight | 100 | 100 | 100 |
| | Plasticizer (3GO) | | | Part by weight | 60 | 60 | 80 |
| | Luminescent material | Eu(HFA)₃phen | | Part by weight | 0.5 | — | — |
| | | Tb(HFA)₃phen | | Part by weight | — | 0.5 | — |
| | | Diethyl 2,5-dihydroxyterephthalate | | Part by weight | — | — | 0.5 |
| | | Naphthalimide | | Part by weight | — | — | — |
| | Film thickness | | | μm | 100 | 100 | 100 |
| Second resin layer | Polyvinyl butyral | | | Part by weight | 100 | 100 | 100 |
| | Plasticizer (3GO) | | | Part by weight | 40 | 40 | 40 |
| | Shape | | | — | Wedge | Wedge | Wedge |
| | Thickness of second resin layer (thick portion) | | | μm | 350 | 350 | 350 |
| | Thickness of second resin layer (thin portion) | | | μm | 600 | 600 | 600 |
| Film shape | Shape | | | — | Wedge | Wedge | Wedge |
| | Laminated structure | | | — | First resin layer/luminescent layer/second resin layer | First resin layer/luminescent layer/second resin layer | First resin layer/luminescent layer/second resin layer |
| | Wedge angle | | | mrad | 0.5 | 0.5 | 0.5 |
| | Total film thickness (thick portion) | | | μm | 1,300 | 1,300 | 1,300 |
| | Total film thickness (thin portion) | | | μm | 800 | 800 | 800 |
| Light rays | Wavelength | | | nm | 405 | 405 | 405 |
| | Output | | | mW | 1 | 1 | 1 |
| | Irradiation diameter | | | cmφ | 0.05 | 0.05 | 0.05 |
| | Density | | | mW/cm² | 509 | 509 | 509 |
| Evaluation | Evaluation of luminance | Laminated glass Central portion | Initial luminance | cd/m² | 13 | 28 | 137 |
| | | | Luminance after 4 W at 100° C. | cd/m² | 12 | 25 | 136 |
| | | | Heat resistance (Δluminance) | cd/m² | 1 | 3 | 1 |
| | | | Evaluation of initial luminance | — | ◯◯ | ◯◯ | ◯◯ |
| | | | Evaluation of heat resistance | — | ◯ | ◯ | ◯ |

TABLE 5-continued

|  |  |  |  |  |  |  |
|---|---|---|---|---|---|---|
| | Laminated glass Edge | Initial luminance | cd/m² | 15 | 30 | 140 |
| | | Luminance after 4 W at 100° C. | cd/m² | 12 | 28 | 143 |
| | | Heat resistance (Δluminance) | cd/m² | 3 | 2 | −3 |
| | | Evaluation of initial luminance | — | ⊚ | ⊚ | ⊚ |
| | | Evaluation of heat resistance | — | ○ | ○ | ○ |
| Evaluation of nightvision | | | — | ⊚ | ⊚ | ⊚ |
| Evaluation of safety | | | — | ○ | ○ | ○ |

TABLE 6

| | | | | Example 24 | Example 25 | Example 26 |
|---|---|---|---|---|---|---|
| First luminescent layer | Polyvinyl butyral | | Part by weight | 100 | 100 | 100 |
| | Plasticizer (3GO) | | Part by weight | 40 | 40 | 40 |
| | Luminescent material | Eu(HFA)₃phen | Part by weight | 0.22 | — | — |
| | | Tb(HFA)₃phen | Part by weight | — | 0.22 | — |
| | | Diethyl 2,5-dihydroxyterephthalate | Part by weight | — | — | 0.22 |
| | | Naphthalimide | Part by weight | — | — | — |
| | Shape | | — | Rectangle | Rectangle | Rectangle |
| | Thickness of first luminescent layer (thick portion) | | μm | 350 | 350 | 350 |
| | Thickness of first luminescent layer (thin portion) | | μm | 350 | 350 | 350 |
| Non-luminescent layer (layer 1) | Polyvinyl butyral | | Part by weight | 100 | 100 | 100 |
| | Plasticizer (3GO) | | Part by weight | 60 | 60 | 60 |
| | Shape | | — | Rectangle | Rectangle | Rectangle |
| | Film thickness | | μm | 100 | 100 | 100 |
| Second luminescent layer | Polyvinyl butyral | | Part by weight | 100 | 100 | 100 |
| | Plasticizer (3GO) | | Part by weight | 40 | 40 | 40 |
| | Luminescent material | Eu(HFA)₃phen | Part by weight | 0.22 | — | — |
| | | Tb(HFA)₃phen | Part by weight | — | 0.22 | — |
| | | Diethyl 2,5-dihydroxyterephthalate | Part by weight | — | — | 0.22 |
| | | Naphthalimide | Part by weight | — | — | — |
| | Shape | | — | Rectangle | Rectangle | Rectangle |
| | Thickness of second luminescent layer (thick portion) | | μm | 350 | 350 | 350 |
| | Thickness of second luminescent layer (thin portion) | | μm | 350 | 350 | 350 |
| Film shape | Shape | | — | Rectangle | Rectangle | Rectangle |
| | Laminated structure | | — | First luminescent layer/non-luminescent layer/second luminescent layer | First luminescent layer/non-luminescent layer/second luminescent layer | First luminescent layer/non-luminescent layer/second luminescent layer |
| | Wedge angle | | mrad | 0 | 0 | 0 |
| | Total film thickness (thick portion) | | μm | 800 | 800 | 800 |
| | Total film thickness (thin portion) | | μm | 800 | 800 | 800 |
| Light rays | Wavelength | | nm | 405 | 405 | 405 |
| | Output | | mW | 1 | 1 | 1 |
| | Irradiation diameter | | cmφ | 0.05 | 0.05 | 0.05 |
| | Density | | mW/cm² | 509 | 509 | 509 |

TABLE 6-continued

| Evaluation | Evaluation of luminance | Laminated glass Central portion | Initial luminance | cd/m² | 32 | 80 | 420 |
|---|---|---|---|---|---|---|---|
| | | | Luminance after 4 W at 100° C. | cd/m² | 30 | 78 | 423 |
| | | | Heat resistance (Δluminance) | cd/m² | 2 | 2 | −3 |
| | | | Evaluation of inital luminance | — | ⊙⊙ | ⊙⊙ | ⊙⊙ |
| | | | Evaluation of heat resistance | — | ◯ | ◯ | ◯ |
| | | Laminated glass Edge | Initial luminance | cd/m² | 34 | 79 | 422 |
| | | | Luminance after 4 W at 100° C. | cd/m² | 30 | 75 | 421 |
| | | | Heat resistance (Δluminance) | cd/m² | 4 | 4 | 1 |
| | | | Evaluation of inital luminance | — | ⊙⊙ | ⊙⊙ | ⊙⊙ |
| | | | Evaluation of heat resistance | — | ◯ | ◯ | ◯ |
| | Evaluation of nightvision | | | — | ⊙⊙ | ⊙⊙ | ◯ |
| | Evalutaion of safety | | | — | ◯ | ◯ | ◯ |

| | | | | Example 27 | Example 28 | Example 29 |
|---|---|---|---|---|---|---|
| First luminescent layer | Polyvinyl butyral | | Part by weight | 100 | 100 | 100 |
| | Plasticizer (3GO) | | Part by weight | 40 | 40 | 40 |
| | Luminescent material | Eu(HFA)₃phen | Part by weight | 0.22 | — | — |
| | | Tb(HFA)₃phen | Part by weight | — | 0.22 | — |
| | | Diethyl 2,5-dihydroxyterephthalate | Part by weight | — | — | 0.22 |
| | | Naphthalimide | Part by weight | — | — | — |
| | Shape | | — | Wedge | Wedge | Wedge |
| | Thickness of first luminescent layer (thick portion) | | μm | 350 | 350 | 350 |
| | Thickness of first luminescent layer (thin portion) | | μm | 600 | 600 | 600 |
| Non-luminescent layer (layer 1) | Polyvinyl butyral | | Part by weight | 100 | 100 | 100 |
| | Plasticizer (3GO) | | Part by weight | 60 | 60 | 60 |
| | Shape | | — | Rectangle | Rectangle | Rectangle |
| | Film thickness | | μm | 100 | 100 | 100 |
| Second luminescent layer | Polyvinyl butyral | | Part by weight | 100 | 100 | 100 |
| | Plasticizer (3GO) | | Part by weight | 40 | 40 | 40 |
| | Luminescent material | Eu(HFA)₃phen | Part by weight | 0.22 | — | — |
| | | Tb(HFA)₃phen | Part by weight | — | 0.22 | — |
| | | Diethyl 2,5-dihydroxyterephthalate | Part by weight | — | — | 0.22 |
| | | Naphthalimide | Part by weight | — | — | — |
| | Shape | | — | Wedge | Wedge | Wedge |
| | Thickness of second luminescent layer (thick portion) | | μm | 350 | 350 | 350 |
| | Thickness of second luminescent layer (thin portion) | | μm | 600 | 600 | 600 |
| Film shape | Shape | | — | Wedge | Wedge | Wedge |
| | Laminated structure | | — | First luminescent layer/non-luminescent layer/second luminescent layer | First luminescent layer/non-luminescent layer/second luminescent layer | First luminescent layer/non-luminescent layer/second luminescent layer |
| | Wedge angle | | mrad | 0.5 | 0.5 | 0.5 |
| | Total film thickness (thick portion) | | μm | 1,300 | 1,300 | 1,300 |
| | Total film thickness (thin portion) | | μm | 800 | 800 | 800 |

TABLE 6-continued

| | | | | | | | |
|---|---|---|---|---|---|---|---|
| Light rays | Wavelength | | | nm | 405 | 405 | 405 |
| | Output | | | mW | 1 | 1 | 1 |
| | Irradiation diameter | | | cmφ | 0.05 | 0.05 | 0.05 |
| | Density | | | mW/cm$^2$ | 509 | 509 | 509 |
| Evaluation | Evaluation of luminance | Laminated glass Central portion | Initial luminance | cd/m$^2$ | 30 | 82 | 425 |
| | | | Luminance after 4 W at 100° C. | cd/m$^2$ | 29 | 79 | 428 |
| | | | Heat resistance (Δluminance) | cd/m$^2$ | 1 | 3 | −3 |
| | | | Evaluation of inital luminance | — | ⊚ | ⊚ | ⊚ |
| | | | Evaluation of heat resistance | — | ○ | ○ | ○ |
| | | Laminated glass Edge | Initial luminance | cd/m$^2$ | 32 | 34 | 425 |
| | | | Luminance after 4 W at 100° C. | cd/m$^2$ | 28 | 81 | 426 |
| | | | Heat resistance (Δluminance) | cd/m$^2$ | 4 | 3 | −1 |
| | | | Evaluation of inital luminance | — | ⊚ | ⊚ | ⊚ |
| | | | Evaluation of heat resistance | — | ○ | ○ | ○ |
| | Evaluation of nightvision | | | — | ⊚ | ⊚ | ○ |
| | Evalutaion of safety | | | — | ○ | ○ | ○ |

According to one or more embodiments of the present invention, it is possible to provide a display apparatus from which a predetermined initial luminance is obtained even in a case where the display apparatus is irradiated with low-intensity light rays, an interlayer film for laminated glass, and laminated glass.

Although embodiments of the disclosure have been described using specific terms, devices, and methods, such description is for illustrative purposes only. The words used are words of description rather than limitation. It is to be understood that changes and variations may be made by those of ordinary skill in the art without departing from the spirit or the scope of the present disclosure, which is set forth in the following claims. In addition, it should be understood that aspects of the various embodiments may be interchanged in whole or in part. Therefore, the spirit and scope of the appended claims should not be limited to the description of the preferred versions contained therein.

REFERENCE SIGNS LIST 1 interlayer film for laminated glass
11 luminescent layer
12 shape-adjusting layer
2 interlayer film for laminated glass
21 luminescent layer
22 shape-adjusting layer
23 shape-adjusting layer
3 interlayer film for laminated glass
31 luminescent layer
32 shape-adjusting layer
33 shape-adjusting layer

What is claimed is:

1. An interlayer film for laminated glass comprising:
a luminescent layer comprising a thermoplastic resin and a lanthanoid complex having a halogen atom-containing multidentate ligand,
wherein the laminated glass emits light at a luminance of 1.3 to 165 cd/m$^2$ when being irradiated with light rays having an output of equal to or less than 1 mW.

2. The interlayer film for laminated glass according to claim 1, wherein the lanthanoid complex is a lanthanoid complex having a halogen atom-containing bidentate ligand or a lanthanoid complex having a halogen atom-containing tridentate ligand.

3. The interlayer film for laminated glass according to claim 1, wherein a total content of potassium, sodium, and magnesium contained in the luminescent layer is equal to or less than 50 ppm.

4. The interlayer film for laminated glass according to claim 1, wherein the halogen atom is a fluorine atom.

5. The interlayer film for laminated glass according to claim 1, wherein the luminescent layer contains a lanthanoid complex having a halogen atom-containing bidentate ligand having an acetylacetone skeleton.

6. Laminated glass comprising the interlayer film for laminated glass according to claim 1, wherein the laminated glass is laminated between a pair of glass plates.

* * * * *